US011976172B2

(12) United States Patent
Li et al.

(10) Patent No.: US 11,976,172 B2
(45) Date of Patent: May 7, 2024

(54) DUAL CURE COMPOSITIONS

(71) Applicant: Saint-Gobain Performance Plastics Corporation, Solon, OH (US)

(72) Inventors: Qiaoxi Li, Marlborough, MA (US); Jianfeng Zhang, Shrewsbury, MA (US); Xipeng Liu, Concord, MA (US); Lian Wang, Storrs, CT (US)

(73) Assignee: Saint-Gobain Performance Plastics Corporation, Solon, OH (US)

( * ) Notice: Subject to any disclaimer, the term of this patent is extended or adjusted under 35 U.S.C. 154(b) by 796 days.

(21) Appl. No.: 16/849,634

(22) Filed: Apr. 15, 2020

(65) Prior Publication Data
US 2020/0332069 A1 Oct. 22, 2020

Related U.S. Application Data

(60) Provisional application No. 62/834,776, filed on Apr. 16, 2019.

(51) Int. Cl.
| | | |
|---|---|---|
| *C08G 77/442* | (2006.01) | |
| *B33Y 10/00* | (2015.01) | |
| *B33Y 70/00* | (2020.01) | |
| *C08G 77/12* | (2006.01) | |
| *C08G 77/20* | (2006.01) | |
| *G03F 7/00* | (2006.01) | |
| *G03F 7/075* | (2006.01) | |

(52) U.S. Cl.
CPC ........... *C08G 77/442* (2013.01); *C08G 77/12* (2013.01); *C08G 77/20* (2013.01); *G03F 7/0037* (2013.01); *G03F 7/0757* (2013.01); *B33Y 10/00* (2014.12); *B33Y 70/00* (2014.12)

(58) Field of Classification Search
CPC ...... C08G 77/442; C08G 77/12; C08G 77/20; G03F 7/0037; G03F 7/0757; B33Y 10/00; B33Y 70/00; B33Y 70/10; B33Y 80/00; B22F 10/12; Y08P 10/25; C08L 83/04
See application file for complete search history.

(56) References Cited

U.S. PATENT DOCUMENTS

| | | | |
|---|---|---|---|
| 5,639,413 A | 6/1997 | Crivello | |
| 9,211,678 B2 | 12/2015 | DeSimone et al. | |
| 2003/0064232 A1 | 4/2003 | Allen et al. | |
| 2006/0116500 A1 | 6/2006 | Chapman et al. | |
| 2014/0131908 A1 | 5/2014 | Sun et al. | |
| 2016/0128911 A1 | 5/2016 | Fontein et al. | |
| 2017/0066185 A1 | 3/2017 | Ermoshkin et al. | |
| 2017/0283655 A1* | 10/2017 | Kenney | B29C 64/106 |
| 2018/0148380 A1* | 5/2018 | Eckel | B33Y 70/10 |
| 2019/0092951 A1 | 3/2019 | Wang et al. | |

FOREIGN PATENT DOCUMENTS

| | | |
|---|---|---|
| CN | 104892944 A | 9/2015 |
| CN | 106752928 A | 5/2017 |
| JP | 2014001316 A | 1/2014 |
| WO | WO2015069454 | 5/2015 |
| WO | WO2016044547 | 3/2016 |
| WO | WO2016134972 | 9/2016 |
| WO | WO2017060573 | 4/2017 |
| WO | WO2017079502 | 5/2017 |
| WO | 2019084397 A1 | 10/2018 |
| WO | WO2019067604 | 4/2019 |

OTHER PUBLICATIONS

International Search Report for International Application No. PCT/US2018/052939 dated Jan. 24, 2019, 4 pages.
International Search Report and Written Opinion in PCT/US2020/028340, dated Jul. 31, 2020.

* cited by examiner

*Primary Examiner* — Jessica M Roswell
(74) *Attorney, Agent, or Firm* — McDonnell Boehnen Hulbert & Berghoff LLP

(57) ABSTRACT

This disclosure relates to polysiloxanes and polysiloxane compositions having dual-curable properties, to methods for forming articles from such compositions, and to articles formed thereby. In one embodiment, the polysiloxane comprises at least about two alkenyl groups and at least about two (meth)acryloyl groups.

22 Claims, 3 Drawing Sheets

A

B

DUAL CURE COMPOSITIONS

CROSS-REFERENCE TO RELATED APPLICATIONS

This application claims the benefit of U.S. Provisional Patent Application No. 62/834,776, which is hereby incorporated herein by reference in its entirety.

BACKGROUND OF THE DISCLOSURE

Field of the Disclosure

This disclosure relates generally to polymerizable polysiloxanes. More particularly, the present disclosure relates to polysiloxanes and polysiloxane compositions having dual-curable properties, to methods for forming articles from such compositions, and to articles formed thereby.

Technical Background

Silicones, also known as polysiloxanes, are polymers made up of repeating siloxane units ($-SiR_2-O-$) in which each R can be any of a wide variety of substituents. Silicones can have desirable mechanical, thermal, and biocompatibility properties, and accordingly are widely used in industry. Many conventional silicones can be polymerized (e.g., to provide a cured material). For example, a liquid curable composition comprising a cross-linkable silicone and a thermal initiator can be rendered into a gel or solid by heating the composition.

However, many of the physical properties of cross-linkable silicones, for example, its high viscosity and low UV sensitivity, can be poorly suited for manufacturing techniques such as continuous-additive processes. For example, conventional three-dimensional printing of silicone compositions can be limited with respect to speed, resolution, and anisotropic properties of the product.

Accordingly, there remains a need for silicone-comprising, polymerizable compositions suitable for continuous-additive processes, e.g., compositions that can be cured relatively quickly, and/or cured to provide a product having improved material properties.

SUMMARY OF THE DISCLOSURE

In one aspect, the disclosure provides a polysiloxane having at least about two alkenyl groups and at least about two (meth)acryloyl groups.

In another aspect, the disclosure provides a polymerizable composition comprising a first polysiloxane having at least about two alkenyl groups and at least about two (meth)acryloyl groups as described herein, present in an amount within the range of 2 wt. % to 99.9 wt. %, an effective amount of a photoinitiator present, for example, in an amount within the range of 0.01 wt. % to about 10 wt. %, and an effective amount of a thermal initiator, present, for example, in an amount within the range of 0.01 wt. % to about 10 wt. %.

In another aspect, the disclosure provides a polymerizable composition comprising a first polysiloxane having at least about two alkenyl groups and at least about two (meth)acryloyl groups as described herein, present in an amount within the range of 2 wt. % to 99 wt. %, a second polysiloxane having at least about one Si—H group (e.g., at least about two Si—H groups), present in an amount within the range of 0.05 wt. % to 50 wt. %, an effective amount of a photoinitiator, present for example, in an amount within the range of 0.01 wt. % to about 10 wt. %, and an effective amount of a hydrosilylation catalyst, present, for example, in an amount within the range of 0.001 wt. % to about 10 wt. %.

In another aspect, the disclosure provides a method for preparing a three-dimensional body, the method comprising providing a polymerizable composition as described herein; and irradiating at least a portion of the polymerizable composition with actinic radiation effective to initiate reaction of the photoinitiator. In certain embodiments, methods according to this aspect of the disclosure further include, after the irradiation, post-curing the irradiated composition, e.g., via heating the irradiated composition to an elevated temperature.

Other aspects of the disclosure will be apparent to the person of ordinary skill in the art in view of the disclosure herein.

DETAILED DESCRIPTION

Figure 1:
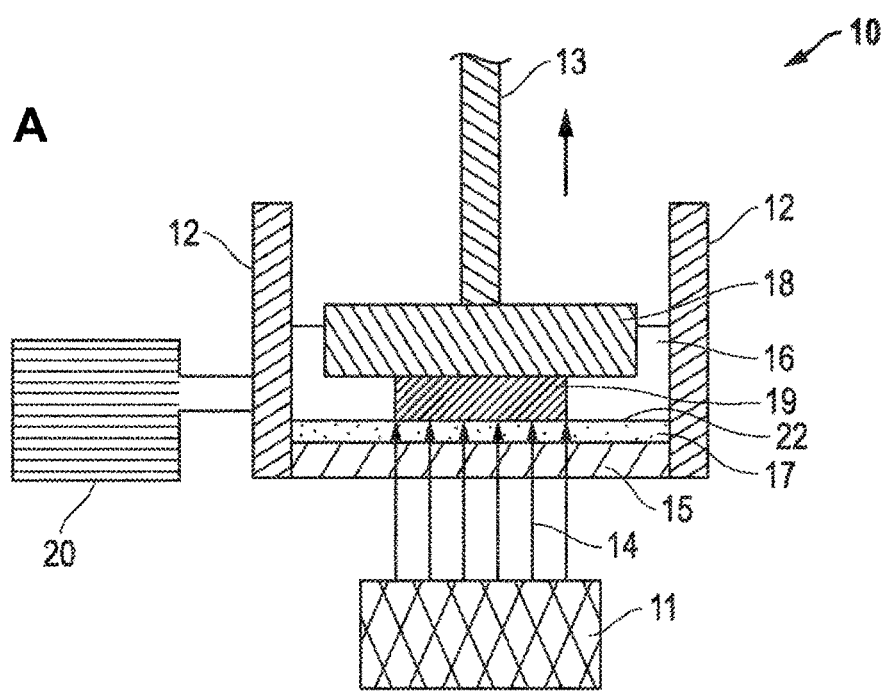
FIG. 1 is an illustration of an apparatus useful in an embodiment of the methods described herein.
Figure 1:
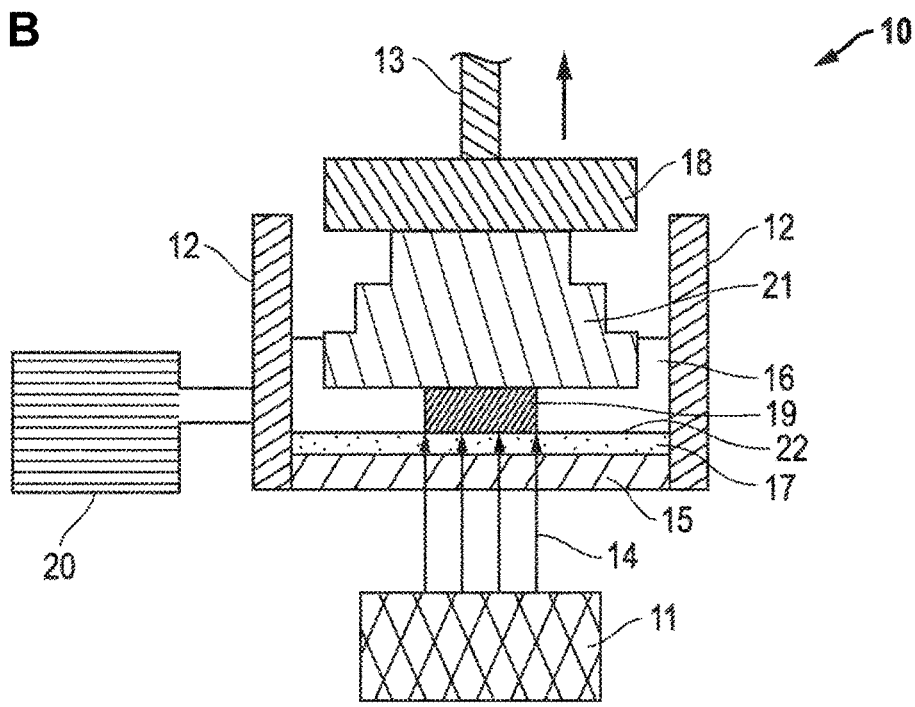

The disclosure relates to polysiloxanes comprising both alkenyl and (meth)acryloyl groups. The present inventors have determined that polymerizable compositions including such polysiloxanes can be polymerized upon irradiation (e.g., using 3-D printing techniques) to provide a relatively resolved, isotropic material. The irradiated material can be further polymerized upon post-curing (e.g., by exposure to an elevated temperature) to provide additional desirable material properties, such as improved tensile strength. Advantageously, in some embodiments the alkenyl (e.g., vinyl or allyl) functionalities can be reacted at a later time than the (meth)acryloyl functionalities, to allow for a staged crosslinking of a material. Thus, photopolymerization of (meth)acrylate functionalities can be performed to provide a two- or three-dimensional structure to the material, with desirable material properties being provided by a later reaction of alkenyl moieties via thermal polymerization.

Accordingly, one aspect of the disclosure is a polysiloxane having at least about two alkenyl groups and at least about two (meth)acryloyl groups. As used herein, an "alkenyl group" of a polysiloxane is not a carbon-carbon double bond of a (meth)acryloyl group.

As used herein, a polymerizable composition includes one or more compounds that can be reacted to provide a composition of larger molecular weight compounds. Moreover, when a chemical substance described herein is referenced in the singular, it is to be understood that such substance (especially when in polymeric form) can contain a distribution of individual molecules having somewhat different characteristics. Accordingly, structural attributes described herein are understood to be on average, on a per-molecule basis. Moreover, even when a chemical substance is described in the singular, it is understood that such description pertains to multiple such substances in combination. Accordingly, "a polysiloxane having at least about two alkenyl groups and at least about two (meth)acryloyl groups" refers not only to a material having on average at least about two alkenyl groups and at least about two (meth)acryloyl groups per molecule, but also combinations of materials each having an average at least about two alkenyl groups and at least about two (meth)acryloyl groups per molecule. In certain embodiments, "at least about two" of any moiety described herein is at least 1.90, at least 1.95, or even at least 1.98 of that moiety per molecule on average. And "about two" of a moiety means, in certain embodiments, in the range of 1.90-2.10, or 1.95-2.05 or 1.98-2.02 of that moiety per molecule on average.

As noted above, polysiloxane compounds of the disclosure include at least about two alkenyl groups per molecule. In certain embodiments as otherwise described herein, the number of alkenyl groups of the polysiloxane is about the same as the number of (meth)acryloyl groups of the polysiloxane. In other embodiments, the number of alkenyl groups of the polysiloxane is less than the number of (meth)acryloyl groups of the polysiloxane. And in other embodiments, the number of alkenyl groups of the polysiloxane is more than the number of (meth)acyrloyl groups of the polysiloxane.

In certain embodiments as otherwise described herein, one or more alkenyl group of the polysiloxane is independently a terminal alkenyl group. In certain such embodiments, each alkenyl group is independently a terminal alkenyl group. For example, in certain embodiments as otherwise described herein, one or more (e.g., each) alkenyl group is independently selected from a but-3-enyl group, an allyl group, or a vinyl group. In certain particular embodiments as otherwise described herein, each alkenyl group is a vinyl group. In other particular embodiments as otherwise described herein, each alkenyl group is an allyl group.

In certain embodiments as otherwise described herein, one or more alkenyl group is independently a non-terminal alkenyl group. In certain such embodiments, each alkenyl group is independently a non-terminal alkenyl group. For example, in certain embodiments as otherwise described herein, one or more (e.g., each) alkenyl group is independently selected from a prop-1-enyl group or a but-2-enyl group.

In certain embodiments, the polysiloxane includes at least one terminal alkenyl group and at least one non-terminal alkenyl group.

The number of alkenyl groups can vary in the polysiloxanes of the disclosure. As the person of ordinary skill in the art will appreciate from the present disclosure, the number of alkenyl groups can influence final, post-cured material properties. The number of alkenyl groups can be quantified, for example, by the number of alkenyl groups per molecule, and also by the fraction of siloxane repeat units that bear alkenyl groups.

In certain embodiments as otherwise described herein, the polysiloxane comprises about 2 alkenyl groups per molecule, e.g., in the range of 1.90-2.10 alkenyl groups per molecule, or in the range of 1.95-2.05 or 1.98-2.02 alkenyl groups per molecule. In other embodiments, the polysiloxane comprises 2 or more alkenyl groups, e.g., 3 or more alkenyl groups, per molecule. For example, in certain such embodiments, the polysiloxane comprises a number of alkenyl groups within the range of 2 to 1,000, or 2 to 750, or 2 to 500, or 2 to 500, or 2 to 400, or 2 to 300, or 2 to 200, or 2 to 100, or 2 to 50, or 2 to 20, or 2 to 10, or 3 to 1,000, or 3 to 750, or 3 to 500, or 3 to 500, or 3 to 400, or 3 to 300, or 3 to 200, or 3 to 100, or 3 to 50, or 3 to 20, or 3 to 10, or 5 to 1,000, or 5 to 500, or 5 to 200, or 5 to 100, or 5 to 50, or 5 to 20, or 25 to 1,000, or 50 to 1,000, or 100 to 1,000, or 250 to 1,000, or 500 to 1,000, or 5 to 200, or 100 to 300, or 200 to 400, or 300 to 500, or 400 to 600, or 500 to 700, or 600 to 800, or 700 to 900.

In certain embodiments as otherwise described herein, the number of siloxane repeat units of the polysiloxane comprising an alkenyl group is within the range of 0.001% to 10% of the total number of siloxane repeat units of the polysiloxane. For example, in certain such embodiments, the number of siloxane repeat units comprising an alkenyl group is within the range of 0.001% to 9%, or 0.001% to 8%, or 0.001% to 7%, or 0.001% to 6%, or 0.001% to 5%, or 0.001% to 4%, or 0.001% to 3%, or 0.001% to 2%, or 0.001% to 1%, or 0.005% to 5%, or 0.01% to 4.5%, or 0.05% to 4%, or 0.1% to 3.5%, or 0.15% to 3%, or 0.2% to 3%, or 0.25% to 3%, or 0.5% to 3%. In other embodiments, the number of siloxane repeat units of the polysiloxane comprising an alkenyl group is within the range of 2% to 20% of the total number of siloxane repeat units of the polysiloxane. For example, in certain embodiments as otherwise described herein, the number of siloxane repeat units comprising an alkenyl group is within the range of 2% to 18%, or 2% to 16%, or 2% to 14%, or 2% to 12%, or 2% to 10%, or 2% to 8%, or 2% to 6%, or 4% to 20%, or 6% to 20%, or 8% to 20%, or 10% to 20%, or 12% to 20%, or 14% to 20%, or 16% to 20%, or 4% to 10%, or 6% to 12%, or 8% to 14%, or 10% to 16%, or 12% to 18%.

In certain embodiments as otherwise described herein, the at least about two alkenyl groups are provided as pendant groups from internal siloxanes of the polysiloxane. In certain such embodiments, the polysiloxane comprises a vinyl-pendant polysiloxane block, e.g., a vinylmethylsiloxane homopolymeric block, a vinylmethylsiloxane-dimethylsiloxane copolymeric block, a vinylmethylsiloxane-dimethylsiloxane-(meth)acryloyloxypropylmethyl siloxane terpolymeric block, etc. Vinyldialkoxyalkylsilanes such as vinyldimethoxymethylsilane can be used as a reactant in the synthesis of such polymers.

In certain embodiments as otherwise described herein, the at least about two alkenyl groups are provided at ends of the polysiloxane. For example, in certain such embodiments, the polysiloxane comprises a vinyl-terminated polysiloxane, e.g., a vinyl-terminated (meth)acryloyloxypropylmethyl homopolymer, a vinyl-terminated (meth)acryloyloxypropylmethyl-dimethylsiloxane copolymer, etc. Vinyldialkylalkoxysilanes such as vinyldimethylethoxysilane can be used as a reactant in the synthesis of such polymers.

In certain embodiments as otherwise described herein, the at least about two alkenyl groups are provided as a combination of at one or more ends of the polysiloxane and as pendant groups from one or more internal siloxanes of the polysiloxane. For example, in certain such embodiments, the polysiloxane comprises a vinyl-terminated, vinyl-pendant polysiloxane, e.g., a vinyl-terminated vinylmethylsiloxane-(meth)acryloyloxypropylmethyl siloxane copolymer, a vinyl-terminated vinylmethylsiloxane-dimethylsiloxane-(meth)acryloyloxypropylmethyl siloxane terpolymer, etc.

As noted above, in addition to the at least about two alkenyl groups per molecule, polysiloxanes of the disclosure include at least about two (meth)acryloyl groups per molecule. In certain embodiments as otherwise described herein, each of the (meth)acryloyl groups is an acryloyl group. In certain other embodiments as otherwise described herein, each of the (meth)acryloyl groups is a methacryloyl group.

The methacryloyl groups can be provided as a variety of functionalities, i.e., depending on the group that links the (meth)acryloyl group to the rest of the molecule. In certain embodiments as otherwise described herein, one or more (meth)acryloyl group is independently a (meth)acryloyloxy group. In certain such embodiments, each (meth)acryloyl group is independently a (meth)acryloyloxy group. For example, in certain embodiments as otherwise described herein, one or more (e.g., each) (meth)acryloyl group is independently a (meth)acryloyloxyalkyl group (e.g., a (meth)acryloyloxyethyl group, a (meth)acryloyloxypropyl group, a (meth)acryloyloxybutyl group, a (meth)acryloyloxypentyl group, a (meth)acryloyloxyhexyl group, etc.).

The number of (meth)acryloxy groups can vary in the polysiloxanes of the disclosure. As the person of ordinary skill in the art will appreciate from the present disclosure, the number of (meth)acryloxy groups can influence not only final, post-cured material properties, but also the curing properties in a rapid fabrication process such as 3D printing and the properties of the "green," partially-cured part made in an initial photoinitiated curing step. The number of (meth)acryloxy groups can be quantified, for example, by the number of (meth)acryloxy groups per molecule, and also by the fraction of siloxane repeat units that bear (meth)acryloxy groups.

In certain embodiments as otherwise described herein, the polysiloxane comprises about 2 (meth)acryloyl groups (e.g., about 2 (meth)acryloyloxyalkyl groups). In other embodiments, the polysiloxane comprises 3 or more (meth)acryloyl groups (e.g., 3 or more (meth)acryloyloxyalkyl groups). For example, in certain embodiments as otherwise described herein, the polysiloxane comprises a number of (meth)acryloyl groups within the range of 2 to 1,000, or 2 to 750, or 2 to 500, or 2 to 500, or 2 to 400, or 2 to 300, or 2 to 200, or 2 to 100, or 2 to 50, or 2 to 20, or 2 to 10, or 3 to 1,000, or 3 to 750, or 3 to 500, or 3 to 500, or 3 to 400, or 3 to 300, or 3 to 200, or 3 to 100, or 3 to 50, or 3 to 20, or 3 to 10, or 5 to 1,000, or 5 to 500, or 5 to 200, or 5 to 100, or 5 to 50, or 5 to 20, or 25 to 1,000, or 50 to 1,000, or 100 to 1,000, or 250 to 1,000, or 500 to 1,000, or 5 to 200, or 100 to 300, or 200 to 400, or 300 to 500, or 400 to 600, or 500 to 700, or 600 to 800, or 700 to 900.

In certain embodiments as otherwise described herein, the number of siloxane repeat units of the polysiloxane comprising a (meth)acryloyl group is within the range of 0.001% to 10% of the total number of siloxane repeat units of the polysiloxane. For example, in certain such embodiments, the number of siloxane repeat units of the polysiloxane comprising a (meth)acryloyl group is within the range of 0.001% to 9%, or 0.001% to 8%, or 0.001% to 7%, or 0.001% to 6%, or 0.001% to 5%, or 0.001% to 4%, or 0.001% to 3%, or 0.001% to 2%, or 0.001% to 1%, or 0.005% to 5%, or 0.01% to 4.5%, or 0.05% to 4%, or 0.1% to 3.5%, or 0.15% to 3%, or 0.2% to 3%, or 0.25% to 3%, or 0.5% to 3% of the total number of siloxane repeat units of the polysiloxane. In other embodiments, the number of siloxane repeat units of the polysiloxane comprising a (meth)acryloyl group is within the range of 2% to 20% of the total number of siloxane repeat units of the polysiloxane. For example, in certain embodiments as otherwise described herein, the number of siloxane repeat units comprising a (meth)acryloyl group is within the range of 2% to 18%, or 2% to 16%, or 2% to 14%, or 2% to 12%, or 2% to 10%, or 2% to 8%, or 2% to 6%, or 4% to 20%, or 6% to 20%, or 8% to 20%, or 10% to 20%, or 12% to 20%, or 14% to 20%, or 16% to 20%, or 4% to 10%, or 6% to 12%, or 8% to 14%, or 10% to 16%, or 12% to 18% total number of siloxane repeat units of the polysiloxane.

In certain embodiments as otherwise described herein, the at least about two (meth)acryloyl groups are provided as pendant groups from internal siloxanes of the polysiloxane. For example, in certain such embodiments, the polysiloxane comprises a (meth)acryloyl-pendant polysiloxane selected from (meth)acryloyloxypropylmethylsiloxane homopolymers, (meth)acryloyloxypropylmethylsiloxane-dimethylsiloxane copolymers, and (meth)acryloyloxypropylmethylsiloxane-dimethylsiloxane-vinylmethylsiloxane terpolymers, (Meth)acryloyloxydialkoxyalkylsilanes such as (meth)acryloyloxypropyldimethoxymethylsilane can be used in the synthesis of such polysiloxanes.

In certain embodiments as otherwise described herein, the at least about two (meth)acryloyl groups are provided at ends of the polysiloxane. For example, in certain such embodiments, the polysiloxane comprises a (meth)acryloyloxypropyl-terminated polysiloxane, e.g., a (meth)acryloyloxypropyl-terminated vinylmethyl homopolymer, a (meth)acryloyloxypropyl-terminated vinylmethyl-dimethylsiloxane copolymer, etc. (Meth)acryloyloxydialkylalkoxysilanes such as (meth)acryloyloxypropyldimethylmethoxysilane can be used in the synthesis of such polysiloxanes.

In certain embodiments as otherwise described herein, the at least about two (meth)acryloyl groups are provided as a combination of at one or more ends of the polysiloxane and as pendant groups from one or more internal siloxanes of the polysiloxane. For example, in certain such embodiments, the polysiloxane comprises a (meth)acryloyloxypropyl-terminated, vinyl-pendant polysiloxane, e.g., a (meth)acryloyloxypropyl-terminated vinylmethylsiloxane-(meth)acryloyloxypropylmethyl siloxane copolymer, a (meth)acryloyloxypropyl-terminated vinylmethylsiloxane-dimethylsiloxane-(meth)acryloyloxypropylmethyl siloxane terpolymer, etc.

In certain embodiments as otherwise described herein, the at least about two alkenyl groups are provided at ends of the polysiloxane, and the at least about two (meth)acryloyl groups are provided as pendant groups from internal siloxanes of the polysiloxane. For example, in certain such embodiments, about two alkenyl groups (e.g., vinyl groups) are provided at ends of the polysiloxane, and a number of (meth)acryloyl groups (e.g., (meth)acryloyloxyalkyl groups) within the range of 3 to 1,000 are provided as pendant groups from internal siloxanes of the polysiloxane. Alternatively, in certain embodiments as otherwise described herein, the at least about two alkenyl groups are provided at ends of the polysiloxane and the at least about two (meth)acryloyl groups are provided as pendant groups from internal siloxanes of the polysiloxane. For example, in certain such embodiments, about two (meth)acryloyl groups (e.g., (meth)acryloyloxyalkyl groups) are provided at ends of the polysiloxane, and a number of alkenyl groups (e.g., vinyl groups) within the range of 3 to 1,000 are provided as pendant groups from internal siloxanes of the polysiloxane.

In certain embodiments as otherwise described herein, two or more alkenyl groups and two or more (meth)acryloyl groups are provided as pendant groups from internal siloxanes of the polysiloxane. For example, in certain such embodiments, a number of alkenyl groups (e.g., vinyl groups) within the range of 3 to 1,000, and a number of (meth)acryloyl groups (e.g., (meth)acryloyloxyalkyl groups) within the range of 3 to 1,000 are provided as pendant groups from internal siloxanes of the polysiloxane. In certain such embodiments, one or more (e.g., two) alkenyl groups (e.g., vinyl groups) are further provided at ends of the polysiloxane.

In certain embodiments as otherwise described herein, each alkenyl group is independently a terminal alkenyl group. For example, in certain such embodiments, each alkenyl group in independently a terminal vinyl group. In certain such embodiments, each (meth)acryloyl group is independently a (meth)acryloyloxyalkyl group. For example, in certain such embodiments, each (meth)acryloyl group is independently a (meth)acryloyloxypropyl group.

For example, in certain embodiments as otherwise described herein, the polysiloxane comprises a compound having the formula (i.e., on a weight average) $A\text{-}B_P\text{-}C_Q\text{-}B_X\text{-}D_Y B_Z\text{-}A'$, wherein:

A is

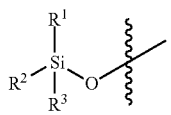

and A' is

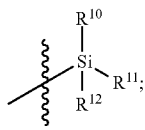

in which each of $R^1$, $R^2$, $R^3$, $R^{10}$, $R^{11}$, and $R^{12}$ is independently $C_2$-$C_{12}$ alkenyl, [((meth)acryloyloxy) $C_1$-$C_{12}$ alkyl], or $C_1$-$C_{60}$ (e.g., $C_1$-$C_6$, or $C_1$-$C_3$) hydrocarbon;

B is

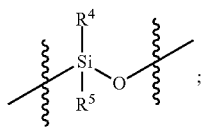

in which each of $R^4$ and $R^6$ is independently $C_1$-$C_{60}$ (e.g., $C_1$-$C_6$, or $C_1$-$C_3$) hydrocarbon;

C is

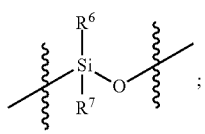

in which $R^6$ is $C_2$-$C_{12}$ alkenyl and $R^7$ is $C_1$-$C_{60}$ (e.g., $C_1$-$C_6$, or $C_1$-$C_3$) hydrocarbon;

D is

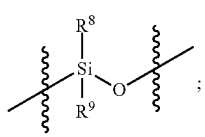

in which $R^8$ is [((meth)acryloyloxy) $C_1$-$C_{12}$ alkyl] and $R^9$ is $C_1$-$C_{60}$ (e.g., $C_1$-$C_6$, or $C_1$-$C_3$) hydrocarbon; and each of P, Q, X, Y, and Z is independently 0-20.000, provided that at least one of P, Q, X, Y, and Z is not zero, and that the polysiloxane comprises at least two alkenyl groups and at least two (meth)acryloyl groups.

In certain embodiments as otherwise described herein, each of $R^1$, $R^3$, $R^{10}$, and $R^{12}$ is independently $C_1$-$C_{60}$ (e.g., $C_1$-$C_6$, or $C_1$-$C_3$) hydrocarbon, each of $R^2$ and $R^{11}$ is independently [((meth)acryloyloxy) $C_1$-$C_{12}$ alkyl], and Q is 1-10,000. For example, in certain such embodiments, Q is 1-9,000, or 1-8,000, or 1-7,000, or 1-6,000, or 1-5,000, or 1-4,000, or 1-3,000, or 1-2,000, or 1-1,000, or 100-10,000, or 250-10,000, or 500-10,000, or 1,000-10,000, or 2,000-10,000, or 3,000-10,000, or 4,000-10,000, or 5,000-10,000, or 500-5,000, or 1,000-6,000, or 2,000-7,000, or 3,000-8,000, Or 4,000-9,000. In certain embodiments, each of X, Y, and Z is 0, and P is 1-10,000. For example, in certain such embodiments, P is 1-9,000, or 1-8,000, or 1-7,000, or 1-6,000, or 1-5,000, or 1-4,000, or 1-3,000, or 1-2,000, or 1-1,000, or 100-10,000, or 250-10,000, or 500-10,000, or 1,000-10,000, or 2,000-10,000, or 3,000-10,000, or 4,000-10,000, or 5,000-10,000, or 500-5,000, or 1,000-6,000, or 2,000-7,000, or 3,000-8,000, or 4,000-9,000. In certain embodiments, each of $R^1$, $R^3$, $R^{10}$, and $R^{12}$ is independently $C_1$-$C_{12}$ alkyl (e.g., $C_1$-$C_6$ alkyl, or $C_1$-$C_3$ alkyl). In certain embodiments, each of $R^2$ and $R^1$ is independently (meth)acryloyloxyethyl, (meth)acryloyloxypropyl, (meth)acryloyloxybutyl, (meth)acryloyloxypentyl, or (meth)acryloyloxyhexyl.

In certain embodiments as otherwise described herein, each of P, Q, X, Y, and Z is 1-10,000. For example, in certain such embodiments, one or more of P, Q, X, Y, and Z is independently 1-9,000, or 1-8,000, or 1-7,000, or 1-6,000, or 1-5,000, or 1-4,000, or 1-3,000, or 1-2,000, or 1-1,000, or 100-10,000, or 250-10,000, or 500-10,000, or 1,000-10,000, or 2,000-10,000, or 3,000-10,000, or 4,000-10,000, or 5,000-10,000, or 500-5,000, or 1,000-6,000, or 2,000-7,000, or 3,000-8,000, or 4,000-9,000. In certain such embodiments, Q is 1-5,000 (e.g., 1-4,000, or 1-3,000, or 1-2,000) and Y is 2-2,000 (e.g., 2-1,500, or 2-1,000). In certain embodiments, each of Q and Y is independently 1-500 (e.g., 1-250, or 1-100), and the total of P, X, and Z are 500-2,500 (e.g., 500-2,000, or 500-1,500).

In certain embodiments, each of $R^1$, $R^3$, $R^{10}$, and $R^{12}$ is independently $C_1$-$C_{60}$ (e.g., $C_1$-$C_6$, or $C_1$-$C_3$) hydrocarbon, and each of $R^2$ and $R^{11}$ is independently $C_2$-$C_{12}$ alkenyl. For example, in certain such embodiments, each of $R^1$, $R^3$, $R^{10}$, and $R^{12}$ is independently $C_1$-$C_{12}$ alkyl (e.g., $C_1$-$C_6$ alkyl, or $C_1$-$C_3$ alkyl). In certain embodiments, each of $R^2$ and $R^{11}$ is independently $C_2$-$C_6$ alkenyl, or $C_2$-$C_4$ alkenyl. Alternatively, in certain embodiments, each $R^1$, $R^2$, $R^3$, $R^{10}$, $R^{11}$, and $R^{12}$ is independently $C_1$-$C_{60}$ (e.g., $C_1$-$C_6$, or $C_1$-$C_3$) hydrocarbon. In certain such embodiments, each $R^1$, $R^2$, $R^3$, $R^{10}$, $R^{11}$, and $R^{12}$ is independently $C_1$-$C_{12}$ alkyl (e.g., $C_1$-$C_6$ alkyl, or $C_1$-$C_3$ alkyl).

For example, in certain embodiments as otherwise described herein, the polysiloxane comprises a polysiloxane terminated with two or more (meth)acryloyloxyalkyl groups and having two or more vinyl groups along its backbone. In certain such embodiments, the (meth)acryloyloxyalkyl groups are, for example, (meth)acryloyloxypropyl groups.

In another example, in certain embodiments as otherwise described herein, the polysiloxane comprises a polysiloxane having two or more vinyl groups and two or more (meth)acryloyloxyalkyl groups along its backbone. In certain such embodiments, the (meth)acryloyloxyalkyl groups are, for example, (meth)acryloyloxypropyl groups. In certain such embodiments, the polysiloxane comprises 1-20 mol. % (meth)acryloyloxyalkyl groups (i.e., based on the number of internal siloxane groups), or 1-18 mol. %, or 1-16 mol. %, or 1-14 mol. %, 011-12 mol. %, or 1-10 mol. %, or 1-9 mol. %, or 1-8 mol. %, or 1-7 mol. %, or 2-20 mol. %, or 3-20 mol. %, or 4-20 mol. %, or 5-20 mol. %, or 6-20 mol. %, or 8-20 mol. %, or 10-20 mol. %, or 3-8 mol. %, or 4-9 mol. %, or 5-10 mol. %, or 6-11 mol. %, or 7-12 mol. %, or 8-13 mol. %, or 9-14 mol. %, or 10-15 mol. % (meth)acryloyloxyalkyl groups. In certain such embodiments, the polysiloxane is terminated with one or more vinyl groups.

One particular example of a polysiloxane according to the disclosure is a random polysiloxane having the weight-average structural formula

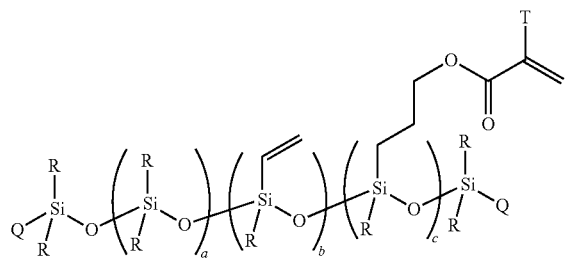

wherein each R is independently $C_1$-$C_3$ alkyl, each Q is independently vinyl, allyl, or $C_1$-$C_3$ alkyl, each T is H or $CH_3$, b is in the range of 1.9 to 5, and a and c are selected to provide the polysiloxane with an overall mole percentage of (meth)acrylate-bearing siloxane subunits (i.e., on a silicon mol % basis) in the range of 1-20%. In certain such embodiments, each R is methyl. In certain such embodiments, each Q is $C_1$-$C_3$ alkyl, e.g., methyl. In other such embodiments, each Q is vinyl or allyl. In certain such embodiments, T is H. In other such embodiments, T is CH3. In certain such embodiments, c is 1.9-3, or 1.9-2.5. The viscosity can be, e.g., in the range of 1000-100000 cst at 20° C., e.g., 2000-20000 cst or 5000-10000 cst at 20° C. In certain embodiments, a, b and c are selected to provide a molecular weight of no more than 1000000 Da, e.g., no more than 500000 Da or no more than 100000 Da.

Another particular example of a polysiloxane according to the disclosure is a random polysiloxane having the weight-average structural formula

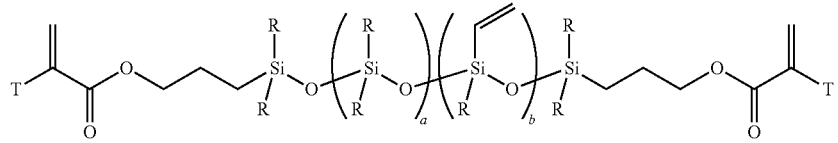

wherein each R is independently $C_1$-$C_3$ alkyl, each T is H or $CH_3$, b is in the range of 1.9 to 5, and a and c are selected to provide the polysiloxane with an overall mole percentage of (meth)acrylate-bearing siloxane subunits (i.e., on a silicon mol % basis) in the range of 1-20%. In certain such embodiments, each R is methyl. In certain such embodiments, T is H. In other such embodiments, T is $CH_3$. In certain such embodiments, b is 1.9-3, or 1.9-2.5. In certain such The viscosity can be, e.g., in the range of 1000-100000 cst at 20° C., e.g., 2000-20000 cst or 5000-10000 cst at 20° C. In certain embodiments, a, and b are selected to provide a molecular weight of no more than 1000000 Da, e.g., no more than 500000 Da or no more than 100000 Da.

In certain embodiments as otherwise described herein, the polysiloxane has a number-average molecular weight within the range of 1 kDa to 100 kDa. For example, in certain such embodiments, the polysiloxane has a number-average molecular weight within the range of 1 kDa to 90 kDa, or 1 kDa to 80 kDa, or 1 kDa to 70 kDa, or 1 kDa to 60 kDa, or 1 kDa to 50 kDa, or 1 kDa to 40 kDa, or 5 kDa to 100 kDa, or 10 kDa to 100 kDa, or 15 kDa to 100 kDa, or 20 kDa to 100 kDa, or 30 kDa to 100 kDa, or 40 kDa to 100 kDa, or 50 kDa to 100 kDa, or 60 kDa to 100 kDa, or 10 kDa to 90 kDa, or 15 kDa to 80 kDa, or 20 kDa to 70 kDa.

In certain embodiments as otherwise described herein, the polysiloxane has a viscosity within the range of 1,000 cst to 20.000 cst, at a temperature within the range of 5° C. to 80° C. (e.g., 20° C.). For example, in certain such embodiments, the polysiloxane has a viscosity within the range of 1,000 cst to 18,000 cst, or 1,000 cst to 16,000 cst, or 1,000 cst to 14,000 cst, or 1,000 cst to 12,000 cst, or 1,000 cst to 10,000 cst, or 1,000 cst to 9,000 cst, or 1,000 cst to 8,000 cst, or 2,000 cst to 20.000 cst, or 3,000 cst to 20,000 cst, or 4,000 cst to 20,000 cst, or 5,000 cst to 20,000 cst, or 6,000 cst to 20,000 cst, or 7,000 cst to 20.000 cst, or 8,000 cst to 20,000 cst, or 9,000 cst to 20,000 cst, or 10,000 cst to 20,000 cst, or 11,000 cst to 20,000 cst, or 12,000 cst to 20,000 cst, or 2,000 cst to 17,500 cst, or 2,000 cst to 15,000 cst, or 2,000 cst to 12,500 cst, or 2,000 cst to 10,000 cst, at a temperature within the range of 5° C. to 80° C. (e.g., 20° C.).

Advantageously, the present inventors have determined that polymerizable compositions including a polysiloxane described herein can be relatively quickly polymerized (e.g., by irradiation) sufficiently to provide a relatively resolved, isotropic material (e.g., through crosslinking of (meth)acryloyl groups), and can be further polymerized upon post-curing (e.g., by exposure to an elevated temperature) to provide additional desirable material properties, such as improved tensile strength (e.g., through crosslinking of vinyl or allyl groups, with one another or via hydrosilylation of a hydride-functional silicone).

Accordingly, another aspect of the disclosure is a polymerizable composition comprising a first polysiloxane as otherwise described herein (i.e., having at least about two alkenyl groups and at least about two (meth)acryloyl groups), present in an amount within the range of 2 wt. % to 99.9 wt. %. The composition includes an effective amount of a photoinitiator, present, for example, in an amount within the range of 0.01 wt. % to about 10 wt. %, and an effective amount of a thermal initiator, present, for example, in an amount within the range of 0.01 wt. % to about 10 wt. %.

For example, in certain such embodiments, the first polysiloxane is present in the composition in an amount within the range of 5 wt. % to 99.9 wt. %, or 10 wt. % to 99.9 wt. %, or 15 wt. % to 99.9 wt. %, or 20 wt. % to 99.9 wt. %, or 25 wt. % to 99.9 wt. %, or 30 wt. % to 99.9 wt. %, or 35 wt. % to 99.9 wt. %, or 40 wt. % to 99.9 wt. %, or 45 wt. % to 99.9 wt. %, or 50 wt. % to 99.9 wt. %, or 55 wt. % to 99.9 wt. %, or 60 wt. % to 99.9 wt. %, or 65 wt. % to 99.9 wt. %, or 70 wt. % to 99.9 wt. %, or 75 wt. % to 99.9 wt. %, or 80 wt. % to 99.9 wt. %, or 5 wt. % to 95 wt. %, or 5 wt. % to 90 wt. %, or 5 wt. % to 85 wt. %, or 5 wt. % to 80 wt. %, or 5 wt. % to 75 wt. %, or 5 wt. % to 70 wt. %, or 5 wt.

% to 65 wt. %, or 5 wt. % to 60 wt. %, or 5 wt. % to 55 wt. %, or 5 wt. % to 50 wt. %, or 5 wt. % to 45 wt. %, or 5 wt. % to 40 wt. %, or 5 wt. % to 35 wt. %, or 5 wt. % to 30 wt. %, or 5 wt. % to 25 wt. %, or 10 wt. % to 30 wt. %, or 15 wt. % to 35 wt. %, or 20 wt. % to 40 wt. %, or 25 wt. % to 45 wt. %, or 30 wt. % to 50 wt. %, or 35 wt. % to 55 wt. %, or 40 wt. % to 60 wt. %, or 45 wt. % to 65 wt. %, or 50 wt. % to 70 wt. %, or 55 wt. % to 75 wt. %, or 60 wt. % to 80 wt. %, or 65 wt. % to 85 wt. %, or 70 wt. % to 90 wt. %, or 75 wt. % to 95 wt. %, or 80 wt. % to 98 wt. %.

As noted above, the polymerizable composition includes an effective amount of a thermal initiator. As used herein, a thermal initiator includes materials that, at an elevated temperature, facilitate polymerization of the polysiloxane. The thermal initiator may, in certain embodiments, facilitate polymerization of the polysiloxane at an elevated temperature and under irradiation, but absent an elevated temperature cannot facilitate, or relatively poorly facilitates, polymerization of the polysiloxane. In certain embodiments as otherwise described herein, the polymerizable composition includes in an effective amount a thermal initiatior selected from di-aralkyl peroxides, alkyl-aralkyl peroxides, and di-alkyl peroxides. For example, in certain such embodiments, the polymerizable composition includes dicumyl peroxide, or Trignox C, bis(2,4-dichlorobenzoyl)peroxide. In another example, the polymerizable composition includes one or more organosiloxanes or organosilanes (e.g., a polysiloxane, or a silane) having one or more Si—H groups, and the thermal initiator is a hydrosilylation catalyst (e.g., a platinum hydrosilylation catalyst). In certain such embodiments, the composition includes an inhibitor that prevents hydrosilylation below an elevated temperature. In other such embodiments, the catalyst is inactive below an elevated temperature. In certain embodiments, the hydrosilylation catalyst can be thermally activated, but can also be activated by extended irradiation (e.g., relative to the irradiation of continuous-additive processes).

In certain embodiments as otherwise described herein, the thermal initiator is present in the polymerizable composition in an amount within the range of 0.05 wt. % to 10 wt. %. For example, in certain such embodiments, the thermal initiator is present in the polymerizable composition in an amount within the range of 0.05 wt. % to 9 wt. %, or 0.05 wt. % to 8 wt. %, or 0.05 wt. % to 7 wt. %, or 0.05 wt. % to 6 wt. %, or 0.05 wt. % to 5 wt. %, or 0.05 wt. % to 4 wt. %, or 0.05 wt. % to 3 wt. %, or 0.05 wt. % to 2 wt. %, or 0.1 wt. % to 8 wt. %, or 0.1 wt. % to 6 wt. %, or 0.5 wt. % to 5 wt. %, or 0.5 wt. % to 4 wt. %, or 0.5 wt. % to 2 wt. %.

Another aspect of the disclosure is a polymerizable composition comprising a first polysiloxane as otherwise described herein (i.e., having at least about two alkenyl groups and at least about two (meth)acryloyl groups), present in an amount within the range of 2 wt. % to 99.9 wt. %, and a second polysiloxane having at least about one Si—H group (e.g., at least about two Si—H groups), present in an amount within the range of 0.05 wt. % to 50 wt. %. The composition includes an effective amount of a photoinitiator, present, for example, in an amount within the range of 0.01 wt. % to about 10 wt. %, and an effective amount of a hydrosilylation catalyst, present, for example, in an amount within the range of 0.001 wt. % to about 10 wt. %.

For example, in certain such embodiments, the first polysiloxane is present in the composition in an amount within the range of 5 wt. % to 99.9 wt. %, or 10 wt. % to 99.9 wt. %, or 15 wt. % to 99.9 wt. %, or 20 wt. % to 99.9 wt. %, or 25 wt. % to 99.9 wt. %, or 30 wt. % to 99.9 wt. %, or 35 wt. % to 99.9 wt. %, or 40 wt. % to 99.9 wt. %, or 45 wt. % to 99.9 wt. %, or 50 wt. % to 99.9 wt. %, or 55 wt. % to 99.9 wt. %, or 60 wt. % to 99.9 wt. %, or 65 wt. % to 99.9 wt. %, or 70 wt. % to 99.9 wt. %, or 75 wt. % to 99.9 wt. %, or 80 wt. % to 99.9 wt. %, or 5 wt. % to 95 wt. %, or 5 wt. % to 90 wt. %, or 5 wt. % to 85 wt. %, or 5 wt. % to 80 wt. %, or 5 wt. % to 75 wt. %, or 5 wt. % to 70 wt. %, or 5 wt. % to 65 wt. %, or 5 wt. % to 60 wt. %, or 5 wt. % to 55 wt. %, or 5 wt. % to 50 wt. %, or 5 wt. % to 45 wt. %, or 5 wt. % to 40 wt. %, or 5 wt. % to 35 wt. %, or 5 wt. % to 30 wt. %, or 5 wt. % to 25 wt. %, or 10 wt. % to 30 wt. %, or 15 wt. % to 35 wt. %, or 20 wt. % to 40 wt. %, or 25 wt. % to 45 wt. %, or 30 wt. % to 50 wt. %, or 35 wt. % to 55 wt. %, or 40 wt. % to 60 wt. %, or 45 wt. % to 65 wt. %, or 50 wt. % to 70 wt. %, or 55 wt. % to 75 wt. %, or 60 wt. % to 80 wt. %, or 65 wt. % to 85 wt. %, or 70 wt. % to 90 wt. %, or 75 wt. % to 95 wt. %, or 80 wt. % to 98 wt. %.

In certain embodiments as otherwise described herein, the second polysiloxane comprises at least about 1.25 Si—H groups (i.e., silicon hydride groups; e.g., capable of reacting with an alkylene group in the presence of a hydrosilylation catalyst), or at least about 1.5 Si—H groups, or at least about 1.75 Si—H groups, or at least about 1.9 Si—H groups, or even at least about 2 Si—H groups.

In certain embodiments as otherwise described herein, the second polysiloxane is present in an amount within the range of 1 wt. % to 40 wt. %. For example, in certain such embodiments, the second polysiloxane is present in an amount within the range of 1 wt. % to 35 wt. %, or 1 wt. % to 30 wt. %, or 1 wt. % to 25 wt. %, or 1 wt. % to 20 wt. %, or 1 wt. % to 15 wt. %, or 1 wt. % to 10 wt. %, or 2.5 wt. % to 40 wt. %, or 5 wt. % to 40 wt. %, or 10 wt. % to 40 wt. %, or 15 wt. % to 40 wt. %, or 20 wt. % to 40 wt. %, or 25 wt. % to 40 wt. %, or 30 wt. % to 40 wt. %, or 2.5 wt. % to 10 wt. %, or 5 wt. % to 15 wt. %, or 10 wt. % to 20 wt. %, or 15 wt. % to 25 wt. %, or 20 wt. % to 30 wt %, or 25 wt. % to 35 wt. %.

In certain embodiments as otherwise described herein, the second polysiloxane has a number-average molecular weight within the range of 1 kDa to 100 kDa. For example, in certain such embodiments, the second polysiloxane has a number-average molecular weight within the range of 1 kDa to 90 kDa, or 1 kDa to 80 kDa, or 1 kDa to 70 kDa, or 1 kDa to 60 kDa, or 1 kDa to 50 kDa, or 1 kDa to 40 kDa, or 5 kDa to 100 kDa, or 10 kDa to 100 kDa, or 15 kDa to 100 kDa, or 20 kDa to 100 kDa, or 30 kDa to 100 kDa, or 40 kDa to 100 kDa, or 50 kDa to 100 kDa, or 60 kDa to 100 kDa, or 10 kDa to 90 kDa, or 15 kDa to 80 kDa, or 20 kDa to 70 kDa.

In certain embodiments as otherwise described herein, the molar ratio of Si—H groups present in the composition to alkenyl groups present in the composition is within the range of 3:2 to 2:3, or within the range of 5:4 to 4:5, or within the range of 9:8 to 8:9. Of course, one or more polysiloxanes present in the composition can comprise alkenyl groups (e.g., the first polysiloxane and a third, or even third and fourth, polysiloxane), and one or more polysiloxanes present in the composition can comprise Si—H groups (e.g., the second polysiloxane and a fourth polysiloxane).

A wide variety of hydrosilylation catalysts are known in the art. The hydrosilylation catalyst may be activated by thermal treatment or exposure to light. In certain embodiments, the hydrosilylation catalyst may be any catalyst comprising one or more platinum-group metals (i.e., platinum, rhodium, ruthenium, palladium, osmium and iridium).

For example, in certain such embodiments, the hydrosilylation catalyst is a platinum catalyst. In certain embodiments as otherwise described herein, the hydrosilylation catalyst is a thermally activated platinum catalyst such as, for example, Karstedt's catalyst (platinum(0)-1,3-divinyl-1,1,3,3-tetramethyldisiloxane) or Speier's catalyst ($H_2PtCl_6$). When the platinum catalyst is thermally-activated, it can act to hydrosilylate only upon thermal treatment, e.g., after an irradiation step that crosslinks via (meth)acryloyl groups.

In other embodiments as otherwise described herein, the hydrosilylation is a light-activated platinum catalyst such as, for example, platinum bis(β-diketonates (such as Pt(acetylacetonate)$_2$, Pf(hexafluoroacetylacetone), and Pt(PPh$_3$)$_2$Cl$_2$), $\eta^5$-cyclopentadienyl trimethyl platinum(IV) complexes, platinum-triazenido complexes. The person of ordinary skill in the art will appreciate that, in certain such embodiments, the irradiation necessary to activate a light-activated hydrosilylation catalyst can differ from the irradiation necessary to activate the photoinitiator of a polymerizable composition as otherwise described herein.

The hydrosilylation catalyst can, in certain embodiments, be a supported hydrosilylation catalyst comprising a solid support having a platinum-group metal on the surface thereof. For example, in certain such embodiments, the hydrosilylation catalyst is a supported catalyst such as platinum on carbon, palladium on carbon, ruthenium on carbon, rhodium on carbon, platinum on silica, palladium on silica, platinum on alumina, palladium on alumina, or ruthenium on alumina. The hydrosilylation catalyst, in certain embodiments, be an encapsulated catalyst, e.g., where a platinum-group metal is encapsulated in a resin, such as a thermoplastic resin.

In certain embodiments, the hydrosilylation catalyst is present in the polymerizable composition in an amount within the range of 0.001 wt. % to 10 wt. %. For example, in certain such embodiments, the hydrosilylation catalyst is present in the polymerizable composition in an amount within the range of 0.001 wt. % to 9 wt. %, or 0.001 wt. % to 8 wt. %, or 0.001 wt. % to 7 wt. %, or 0.001 wt. % to 6 wt. %, or 0.001 wt. % to 5 wt. %, or 0.001 wt. % to 4 wt. %, or 0.001 wt. % to 3 wt. %, or 0.001 wt. % to 2 wt. %, or 0.005 wt. % to 10 wt. %, or 0.01 wt. % to 10 wt. %, or 0.025 wt. % to 10 wt. %, or 0.05 wt. % to 10 wt. %, or 0.1 wt. % to 10 wt. %, or 0.15 wt. % to 10 wt. %, or 0.2 wt. % to 10 wt. %, or 0.3 wt. % to 10 wt. %, or 0.4 wt. % to 10 wt. %, or 0.5 wt. % to 10 wt. %, or 0.01 wt. % to 8 wt. %, or 0.025 wt. % to 7 wt. %, or 0.05 wt. % to 6 wt. %, or 0.1 wt. % to 5 wt. %, or 0.1 wt. % to 4 wt. %, or 0.1 wt. % to 3 wt. %, or 0.1 wt. % to 2 wt. %. In certain embodiments, the hydrosilylation catalyst is present in the polymerizable composition in an amount sufficient to provide an amount of platinum-group metals within the range of 0.1 ppm to 1000 ppm of one or more platinum-group metals, for example, from about 0.5 to about 100 ppm, or about 10 to about 50 ppm, or about 10 to about 30 ppm, or about 20 to about 30 ppm, calculated on an elemental mass basis.

As noted above, the polymerizable compositions described herein include an effective amount of a photoinitiator. As used herein, a photoinitiator includes materials that, under irradiation (e.g., with UV radiation), facilitate polymerization of the polysiloxane (e.g., by initiating free-radical cross-linking of (meth)acryloyl groups). For example, in certain embodiments as otherwise described herein, the polymerizable composition includes in an effective amount a photoinitiator selected from benzil, a benzoin compound (e.g., a benzoin ether), a benzyl ketal, an α-dialkoxyacetophenone, an α-hydroxyalkylphenones, an α-aminoalkylphenones, an acyl-phosphine oxide, a benzophenone, a benzoamine, a thioxanthone, a thioamine, and a titanocene. In another example, the polymerizable composition includes in an effective amount a photoinitiator selected from cationic photoinifitators such as azobisisobutyronitrile (AIBN), 2,2-dimethoxy-2-phenylacetophenone (RMPA), benzoyl peroxide, 2-hydroxy-2-methyl-I-phenyl-1-propanone (HMPP), benzoin, benzoin ethyl ether, benzoin methyl ether, 4,4'-dimethoxybenzoin, 4,4'-dimethylbenzil, 2-benzyl-2-(dimethylamino)-4'-morpholinobutyrophenone, 4'-tert-butyl-2',6'-dimethylacetophenone, 2,2-diethoxyacetophenone, 2,2-dimethoxy-2-phenylacetophenone, diphenyl(2,4,6-trimethylbenzoyl)phosphine oxide/2-hydroxy-2-methylpropiophenone, 4'-ethoxyacetophenone, 3'-hydroxyacetophenone, 4'-hydroxyacetophenone, 1-hydroxycyclohexyl phenyl ketone, 2-hydroxy-4'-(2-hydroxyethoxy)-2-methylpropiophenone, 2-hydroxy-2-methylpropiophenone, 2-methyl-4'-(methylthio)-2-morpholinopropiophenone, 4'-phenoxyacetophenone, benzophenone, benzophenone-3,3',4,4'-tetracarboxylic dianhydride, 4-benzoylbiphenyl, 4,4'-bis(diethylamino)benzophenone, 4,4'-bis [2-(1-propenyl)phenoxy]-benzophenone, 4-(diethylamino)benzophenone, 4,4'-dihydroxybenzophenone, 4-(dimethylamino)benzophenone, 3,4-dimethylbenzophenone, 3-hydroxybenzophenone, 4-hydroxybenzophenone, 2-methylbenzophenone, 3-methylbenzophenone, 4-methyl-benzophenone, methyl benzoylformate, Michler's ketone, bis(4-tert-butylphenyl)iodonium perfluoro-1-butanesulfonate, bis(4-tert-butylphenyl)iodonium p-toluenesulfonate, bis(4-tert-butylphenyl)iodonium triflate, boc-methoxyphenyldiphenylsulfonium triflate, (4-bromophenyl)-diphenylsulfonium triflate, (tert-butoxycarbonylmethoxynaphthyl)-diphenylsulfonium triflate, (4-tert-butylphenyl)diphenylsulfonium triflate, diphenyliodonium hexafluorophosphate, diphenyliodonium nitrate, diphenyliodonium perfluoro-1-butanesulfonate, diphenyliodonium p-toluenesulfonate, diphenyliodonium triflate, (4-fluorophenyl)diphenylsulfonium triflate, N-hydroxynaphthalimide triflate, N-hydroxy-5-norbornene-2,3-dicarboximide perfluoro-1-butanesulfonate, (4-iodophenyl)diphenylsulfonium triflate, (4-methoxyphenyl)diphenylsulfonium triflate, 2-(4-methoxystyryl)-4,6-bis(trichloromethyl)-1,3,5-triazine, (4-methylphenyl)-diphenylsulfonium triflate, (4-methylthiophenyl)methyl phenyl sulfonium triflate, 1-naphthyl diphenylsulfonium triflate, (4-phenoxyphenyl)diphenylsulfonium triflate, (4-phenylthiophenyl)-diphenylsulfonium triflate, triarylsulfonium hexafluoroantimonate salt, triarylsulfonium hexafluorophosphate salt, triphenylsulfonium perfluoro-1-butanesufonate, triphenylsulfonium triflate, tris(4-tert-butylphenyl)sulfonium perfluoro-1-butanesulfonate, tris(4-tert-butylphenyl)-sulfonium triflate, anthraquinone-2-sulfonic acid sodium salt monohydrate, 2-tert-butylanthraquinone, camphorquinone, diphenyl(2,4,6-trimethylbenzoyl)phosphine oxide, 9,10-phenanthrenequinoxide, bis(2,4,6-trimethylbenzoyl)-phenylphosphineoxide, 1-chloro-4-propoxy-9H-thioxanthen-9-one, 2-chlorothioxanthen-9-one, 2,4-diethyl-9H-thioxanthen-9-one, isopropyl-9H-thioxanthen-9-one, 10-methylphenothiazine, and thioxanthen-9-one.

In certain embodiments as otherwise described herein, the photoinitiator can absorb at relatively long wavelengths, such as, for example, at least 370 nm, or at least 380 nm. The person of ordinary skill in the art will appreciate that such absorption wavelengths can be useful in continuous-additive processes (e.g., using three-dimensional printing systems employing lamps that emit at such wavelengths). For example, in certain embodiments as otherwise described herein, the photoinitiator comprises 1-phenyl-1,2-propanedione. In another example, in certain embodiments as otherwise described herein, the photoinitiator comprises diphenyl(2,4,6-trimethylbenzoyl)phosphine oxide (TPO).

In certain embodiments as otherwise described herein, the photoinitiator is a mixture of two or more photoinitiators. For example, in certain such embodiments, the photoinitiator comprises a first photoinitiator and a second photoinitiator, the first photoinitiator having a substantially higher absorption (e.g., at least 2 times, at least 5 times, or even at least 10 times higher) than the second at relatively long wavelengths (e.g., at least 360 nm, or at least 370 nm, or even at least 380 nm). In certain such embodiments, the polymerizable composition includes a first photoinitiator having an absorption at 380 nm that is at least 2 times higher (e.g., at least 5 times, or at least 10 times higher) than that of a second photoinitiator also included in the composition. In certain such embodiments, the long-wavelength photoinitiator can, upon longer-wavelength irradiation, decompose to form radicals, which can cause the shorter-wavelength photoinitiator to decompose to radicals (e.g., initiating free-radical polymerization).

For example, in certain embodiments as otherwise described herein, the photoinitiator is a mixture of photoinitiators, the mixture comprising diphenyl(2,4,6-trimethylbenzoyl)phosphine oxide (TPO) and 2,2-dimethoxy-2-phenylacetophenone (DMAPA). In certain such embodiments, TPO and DMAPA are present in a molar ratio (i.e., TPO: DMAPA) within the range of 10:90 to 30:70, or 15:85 to 25:75.

In certain embodiments, the wavelength and/or extent of irradiation sufficient to activate the photoinitiator of a polymerizable composition described herein (e.g., to provide radical initiation of (meth)acryloyl cross-linking reactions) is insufficient to activate a light-activated hydrosilylation catalyst. For example, in certain such embodiments, a polymerizable composition including a second polysiloxane having at least about one Si—H group, a light-activated hydrosilylation catalyst, and a photoinitiator such as, for example, a mixture of TPO and DMAPA, can be irradiated at a wavelength around 395 nm for a relatively short period of time (e.g., as in a continuous-additive process) to provide cross-links at (meth)acryloyl groups of the first polysiloxane, but to leave at least about two alkenyl groups of the first polysiloxane unreacted. In certain such embodiments, irradiation at a shorter wavelength, and/or for an extended period of time (e.g., in a UV-curing chamber) can further polymerize the composition through hydrosilylation.

In certain embodiments, the photoinitiator is present in the polymerizable composition in an amount within the range of 0.01 wt. % to 10 wt. %. For example, in certain such embodiments, the photoinitiator is present in the polymerizable composition in an amount within the range of 0.01 wt. % to 9 wt. %, or 0.01 wt. % to 8 wt. %, or 0.01 wt. % to 7 wt. %, or 0.01 wt. % to 6 wt. %, or 0.01 wt. % to 5 wt. %, or 0.01 wt. % to 4 wt. %, or 0.01 wt. % to 3 wt. %, or 0.01 wt. % to 2 wt. %, or 0.05 wt. % to 10 wt. %, or 0.1 wt. % to 10 wt. %, or 0.15 wt. % to 10 wt. %, or 0.2 wt. % to 10 wt. %, or 0.3 wt. % to 10 wt. %, or 0.4 wt. % to 10 wt. %, or 0.5 wt. % to 10 wt. %, or 0.05 wt. % to 8 wt. %, or 0.05 wt. % to 7 wt. %, or 0.05 wt. % to 6 wt. %, or 0.1 wt. % to 5 wt. %, or 0.1 wt. % to 4 wt. %, or 0.1 wt. % to 3 wt. %, or 0.1 wt. % to 2 wt. %.

In certain embodiments as otherwise described herein, the polymerizable composition further comprises one or more of a third polysiloxane having at least one alkenyl group (e.g., at least about two alkenyl groups), present in an amount within the range of 0.05 wt. % to 60 wt. %, and a fourth polysiloxane having at least about one (meth)acryloyl group (e.g., at least about two (meth)acryloyl groups), present in an amount within the range of 0.05 wt. % to 40 wt. %.

In certain embodiments, the polymerizable composition comprises a third polysiloxane having at least about one alkenyl group, present in an amount within the range of 0.05 wt. % to 60 wt. %. For example, in certain such embodiments the third polysiloxane is present in an amount within the range of 0.5 wt. % to 50 wt. %, or 1 wt. % to 40 wt. %, or 5 wt. % to 25 wt. %, or 10 wt. % to 30 wt. %, or 15 wt. % to 35 wt. % or 20 wt. % to 40 wt. %, or 25 wt. % to 45 wt. %, or 30 wt. % to 50 wt. %, or 35 wt. % to 55 wt. %, or 40 wt. % to 60 wt. %. In certain such embodiments, the third polysiloxane comprises at least about 1.25 alkenyl groups, or at least about 1.5 alkenyl groups, or at least about 1.75 alkenyl groups, or at least about 1.9 alkenyl groups, or even at least about 2 alkenyl groups.

In certain embodiments, the polymerizable composition includes a second polysiloxane (i.e., having at least about one Si—H group) and a third polysiloxane (i.e., having at least about one alkenyl group), and the polysiloxanes are provided together, for example, as parts of a curable liquid silicone rubber (LSR) or liquid injection molding silicone (LIMS) formulation. In certain such embodiments, the second polysiloxane and the third polysiloxane comprise the components of, for example, Dow Corning Shore 50, QP1-230, QP1-240, QP1-250, QP1-260, and QP1-270 LSR (all available from Dow Corning Corporation, Auburn, Michigan), Silopren UV LSR 2030 and UV LSR 2060 (available from Momentive), UV-PDMS KER-4690 and KER-4691 (available from Shin-Etsu), and Powersil 680 UV (Wacker). Of course, in other embodiments, the second polysiloxane and the third polysiloxane can be provided separately.

In certain embodiments as otherwise described herein, the third polysiloxane has a number-average molecular weight within the range of 1 kDa to 100 kDa. For example, in certain such embodiments, the third polysiloxane has a number-average molecular weight within the range of 1 kDa to 90 kDa, or 1 kDa to 80 kDa, or 1 kDa to 70 kDa, or 1 kDa to 60 kDa, or 1 kDa to 50 kDa, or 1 kDa to 40 kDa, or 5 kDa to 100 kDa, or 10 kDa to 100 kDa, or 15 kDa to 100 kDa, or 20 kDa to 100 kDa, or 30 kDa to 100 kDa, or 40 kDa to 100 kDa, or 50 kDa to 100 kDa, or 60 kDa to 100 kDa, or 10 kDa to 90 kDa, or 15 kDa to 80 kDa, or 20 kDa to 70 kDa.

In certain embodiments, the polymerizable composition comprises a fourth polysiloxane having at least about one (meth)acryloyl group, present in an amount within the range of about 0.05 wt. % to 40 wt. %. For example, in certain such embodiments the fourth polysiloxane is present in an amount within the range of about 0.5 to 35 wt. %, or 1 wt. % to 30 wt. %, or 5 wt. % to 20 wt. %, or 10 wt. % to 25 wt. %, or 15 wt. % to 30 wt. %, or 20 wt. % to 35 wt. %. In certain such embodiments, the third polysiloxane comprises at least about 1.25 (meth)acryloyl groups, or at least about 1.5 (meth)acryloyl groups, or at least about 1.75 (meth)acryloyl groups, or at least about 1.9 (meth)acryloyl groups, or even at least about 2 (meth)acryloyl groups.

In certain embodiments as otherwise described herein, the polymerizable composition comprises a fourth polysiloxane selected from, for example, poly(dimethylsiloxane-co-(methacryloxypropyl)methylsiloxane) or methacryloxypropyl terminated poly(dimethylsiloxane) (e.g., Gelest RMS-083, Gelest DMS-U21, Gelest DMS-R05, Gelest DMS-R11, Gelest DMS-R18, Gelest DMS-R22, Gelest DMS-R31, Gelest RMS-033, Gelest RMS-044, Gelest UMS-182, and Gelest UMS-992 (all available from Gelest, Morrisville, Pennsylvania)).

In certain embodiments as otherwise described herein, the fourth polysiloxane has a number-average molecular weight within the range of 1 kDa to 100 kDa. For example, in certain such embodiments, the fourth polysiloxane has a number-average molecular weight within the range of 1 kDa to 90 kDa, or 1 kDa to 80 kDa, or 1 kDa to 70 kDa, or 1 kDa to 60 kDa, or 1 kDa to 50 kDa, or 1 kDa to 40 kDa, or 5 kDa to 100 kDa, or 10 kDa to 100 kDa, or 15 kDa to 100 kDa, or 20 kDa to 100 kDa, or 30 kDa to 100 kDa, or 40 kDa to 100 kDa, or 50 kDa to 100 kDa, or 60 kDa to 100 kDa, or 10 kDa to 90 kDa, or 15 kDa to 80 kDa, or 20 kDa to 70 kDa.

In certain embodiments as otherwise described herein, the polymerizable composition further comprises a fifth polysiloxane having at least about one Si—H group and at least about one alkenyl group, present in an amount within the range of 0.05 wt. % to 80 wt. %. In certain embodiments, the polymerizable composition includes a second polysiloxane (i.e., having at least about one Si—H group) and a hydrosilylation catalyst that can catalyze the polymerization of the second polysiloxane and of the fifth polysiloxane. In other embodiments, the polymerizable composition includes an effective amount of an additional hydrosilylation catalyst that can catalyze polymerization of the fifth polysiloxane.

In certain embodiments, the fifth polysiloxane is present in an amount within the range of 1 wt. % to 70 wt. %, or 10 wt. % to 60 wt. %, or 10 wt. % to 50 wt. %, or 10 wt. % to 40 wt. %, or 15 wt. % to 45 wt. %, or 20 wt. % to 50 wt. %, or 25 wt. % to 55 wt. %, or 30 wt. % to 60 wt. %, or 35 wt. % to 65 wt. %, or 40 wt. % to 70 wt. %, or 45 wt. % to 75 wt. %, or 50 wt. % to 80 wt. %.

In certain embodiments as otherwise described herein, the polymerizable composition includes a fifth polysiloxane selected from, for example, α-monovinyl-ω-monohydride terminated polysiloxanes such as α-monovinyl-ω-monohydride terminated poly(dimethylsiloxane) (e.g., Gelest DMS-HV15, Gelest DMS-22, and Gelest ExSil™ 100 (both available from Gelest, Morrisville, Pennsylvania)).

In certain embodiments as otherwise described herein, the fifth polysiloxane has a number-average molecular weight within the range of 1 kDa to 100 kDa. For example, in certain such embodiments, the fifth polysiloxane has a number-average molecular weight within the range of 1 kDa to 70 kDa, or 1 kDa to 50 kDa, or 1 kDa to 35 kDa, or 1 kDa to 30 kDa, or 1 kDa to 25 kDa, or 1 kDa to 20 kDa, or 5 kDa to 50 kDa, or 5 kDa to 50 kDa, or 5 kDa to 40 kDa, or 5 kDa to 30 kDa, or 5 kDa to 20 kDa.

For example, in certain embodiments as otherwise described herein, the first polysiloxane is present in an amount within the range of 5 wt. % to 30 wt. %. In certain such embodiments, the first polysiloxane comprises two or more alkenyl groups (e.g., vinyl groups) provided as pendant groups from one or more internal siloxanes of the polysiloxane, and two or more (meth)acryloyl groups provided as pendant groups from one or more internal siloxanes of the polysiloxane. In certain such embodiments, the first polysiloxane comprises about two vinyl groups, and a number of (meth)acryloyl groups that is within the range of 2% to 20% of the total number of siloxane repeat units of the polysiloxane. In certain embodiments as otherwise described herein, the second polysiloxane is present in an amount within the range of 10 wt. % to 35 wt. %, and the third polysiloxane is present in an amount within the range of 10 wt. % to 35 wt. %. In certain such embodiments, the second polysiloxane and the third polysiloxane comprise components of a liquid silicon rubber formulation. In certain embodiments as otherwise described herein, the fourth polysiloxane is present in an amount within the range of 5 wt. % to 30 wt. %. In certain such embodiments, the fourth polysiloxane comprises about two (meth)acryloyl groups. In certain embodiments as otherwise described herein, the fifth polysiloxane is present in an amount within the range of 15 wt. % to 50 wt. %. In certain such embodiments, the fifth polysiloxane comprises about one alkenyl group and about one Si—H group.

In certain embodiments as otherwise described herein, the polymerizable composition further comprises one or more particulate fillers. A variety of fillers are known in the art, such as, for example, ceramic particles, glass particles, metallic particles, polymeric particles, or a combination thereof. For example, in certain such embodiments, the filler is selected from of silicon dioxide ($SiO_2$) compounds, such as fumed silica (i.e., amorphous silica having particle size of about 5-50 nm and a surface area of about 50-600 m$^2$/g), silica fume (or micro silica; i.e., amorphous silica having particle size of less than 1 μm, with average about 150 nm, and a surface area of about 15-30 m$^2$/g), fused quartz (or fused silica), perlite (i.e., an amorphous volcanic glass, which is mostly silica with some aluminum oxide), diatomaceous earth (i.e., silica rock having an average particle size of 10-200 μm), fly ash (i.e., coal combustion byproduct comprising amorphous and crystalline silica, $Al_2O_3$, $Fe_2O_3$, and CaO), slag or slag cement (i.e., byproduct of metal smelting comprising a mixture of silica and metal oxides), alumina, ceria, magnesium-magnesia aluminate (MMA), magnesium oxide, silicon nitride, silicon carbide, hydroxyapatite, cordierite, soda-lime glass, low iron glass, borosilicate glass, or a combination thereof. In certain such embodiments, the composition comprises fumed silica. In certain embodiments as otherwise described herein, the polymerizable composition includes a non-reactive polysiloxane filler, or a mono-functional reactive polysiloxane filler.

The filler can have any suitable particle size, e.g., the longest dimension of the particle, such as the average longest dimension. For example, in certain embodiments as otherwise described herein, the filler has a primary particle size of about 5 nm to about 100 nm, about 10 to about 30 nm, or about 5 nm or less, or about 50 nm or more, or about 100 nm or more. As used herein, "primary" particle size refers to the actual particles in their unagglomerated state, which can optionally agglomerate to form larger "secondary" particles.

In certain embodiments as otherwise described herein, the polymerizable composition comprises a filler in an amount up to about 50 wt. %. In certain such embodiments, the polymerizable composition comprises a filler in an amount within the range of about 1 wt. % to 50 wt. %, or 2.5 wt. % to 50 wt. %, or 5 wt. % to 50 wt. %, or 10 wt. % to 50 wt. %, or 15 wt. % to 50 wt. %, or 20 wt. % to 50 wt. %, or 25 wt. % to 50 wt. %, or 30 wt. % to 50 wt. %, or 1 wt. % to 40 wt. %, or 1 wt. % to 30 wt. %, or 1 wt. % to 20 wt. %, or 10 wt. % to 30 wt. %, or 20 wt. % to 40 wt. %, or 30 wt. % to 50 wt. %. In certain such embodiments, the filler comprises silica (e.g., fumed silica). In certain such embodiments, the filler comprises silicone resin or a silsesquioxane. In certain embodiments, the filler comprises one or more metal oxides (e.g., calcium oxide, zinc oxide, magnesium oxide).

In certain embodiments as otherwise described herein, the polymerizable composition further comprises one or more inhibitors. A variety of inhibitors are known in the art, such as, for example, amines (e.g., ammonia, ethyl amine, di- and trialkyl amines) and inert dyes.

Of course, the polymerizable compositions described herein may also comprise one or more additives known in the art, such as, for example, plasticizer, dispersing agents, debinding accelerators, pH regulators, a pharmaceutically active ingredient, or any combination thereof.

In certain embodiments as otherwise described herein, the polysiloxanes, the thermal initiator and/or hydrosilylation catalyst, the photoinitiator, fillers, and inhibitors are present in the polymerizable composition in a combined amount of at least about 80 wt. %, or at least about 90 wt. %, or at least about 92.5 wt. %, or at least about 95 wt. %, or at least about 97.5 wt. %.

In certain embodiments as otherwise describe herein, the polymerizable composition has a viscosity of less than 15,000 cst, or less than 10,000 cst, or less than or less than 9,000 cst, or less than 8,000 cst, or even less than 7,000 cst. In certain embodiments as otherwise described herein, the polymerizable composition has a viscosity at 25° C. of about 100 cst to about 10,000 cst, or about 100 cst to about 8,000 cst, or about 100 cst to about 6,000 cst, or about 100 cst to about 5,000 cst, or about 1,000 cst to about 10,000 cst, or about 1,000 cst to about 8,000 cst, or about 1,000 cst to about 6,000 cst, or about 1,000 cst to about 5,000 cst, or about 3,000 cst to about 10,000 cst, or about 3,000 cst to about 8,000 cst, or about 3,000 cst to about 6,000 cst, or about 3,000 cst to about 5,000 cst, or about 5,000 cst to about 10,000 cst, or about 5,000 cst to about 9,000 cst, or about 5,000 cst to about 8,000 cst, or about 5,000 cst to about 7,000 cst, or about 5,000 cst to about 6,000 cst. In certain embodiments as otherwise described herein, the polymerizable composition has a viscosity of at least 50 cP at a shear rate of 5 Hz. For example, in certain such embodiments, the polymerizable composition of the disclosure has a viscosity of no more than 10,000 cP, no more than 5000 cP, or even no more than 1,000 cP at a shear rate of 25 Hz. Of course, the person of ordinary skill in the art will appreciate that the polymerizable compositions as otherwise described herein can be mixed with a solvent (e.g., silicone-compatible organic solvents (such as toluene and xylene), silicone-containing fluids (such as octamethylcyclotetrasiloxane (D4) and decamethylcyclopentasiloxane (D5))) to obtain a desired viscosity (e.g., for continuous-additive processes).

Advantageously, the present inventors have determined that the (meth)acryloyl groups of the polymerizable composition can relatively quickly form cross-links upon irradiation, providing a relatively resolved, isotropic material, and accordingly can be suitable for continuous-additive processes.

Accordingly, another aspect of the disclosure is a method for preparing a three-dimensional body, the method comprising providing a polymerizable composition described herein, and irradiating at least a portion of the polymerizable composition with actinic radiation.

In certain embodiments as otherwise described herein, the method comprises providing the polymerizable composition and optionally a solvent between a substrate and an actinic radiation source; and then concurrently irradiating at least a portion of the polymerizable composition with actinic radiation and translating the substrate in a direction away from the actinic radiation source. In certain such embodiments, the irradiating is insufficient to cause thermally activated cross-linking (e.g., of alkenyl groups) or light- or thermally activated hydrosilylation.

Figure 2:
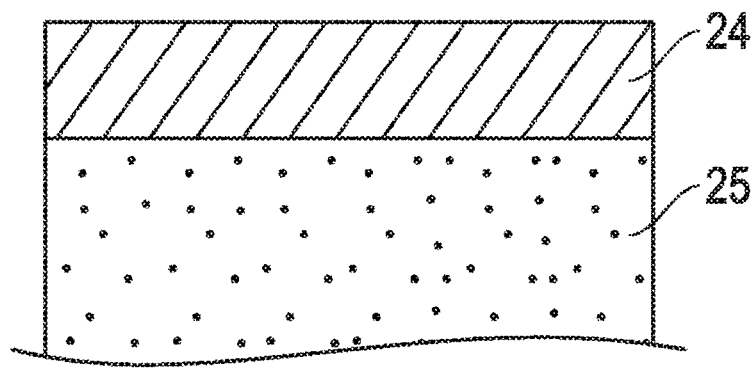
FIG. 2 is an illustration of a bottom portion of an apparatus useful n an embodiment of the methods described herein.
Figure 2:
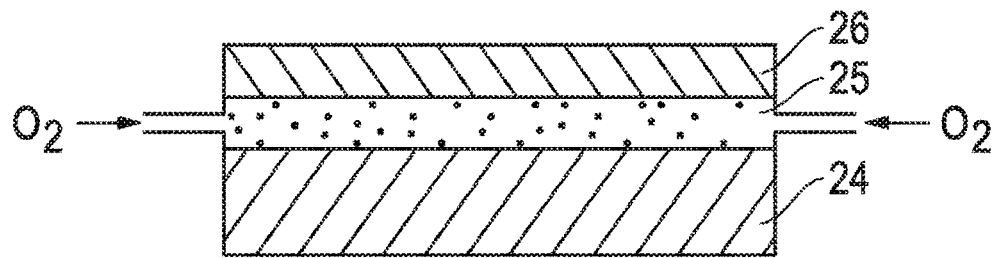

For example, an embodiment of the method can be performed using the assembly shown in schematic view in FIGS. 1-2. As shown FIG. 1A, the assembly can have a computer controlled electromagnetic radiation unit (11), a chamber (12), and a construction unit (13). The electromagnetic radiation unit (11) can include a UV or visible light (i.e., actinic radiation) (14) emitting radiation source, for example, a laser or a light emitting diode (LED) and may project a varying CAD/CAM created two-dimensional image onto a transparent window (15) at the bottom of the chamber (12). The chamber (12) can include a mixture (16) that can include the polymerizable composition of the disclosure and optionally a solvent. The transparent window (15) of the chamber can also be semipermeable for an inhibitor gas or may include an additional semipermeable layer (not shown) for the penetration of an inhibitor, for example oxygen, into the mixture (16) of the chamber (12). During the forming process, the inhibitor may enter the chamber (12) by permeating the transparent window (15) and form an inhibition zone (17) at a bottom region of the mixture (16). In the inhibition zone (17) the inhibitor can limit or prevent curing of the mixture (16) by the electromagnetic radiation.

According to one embodiment, a carrier plate (18) (i.e., a substrate) can be positioned above the chamber (12). The position between the carrier plate (18) and the mixture in the chamber (12) can be changed during the forming process to facilitate formation of the three-dimensional body. When the formation of the three-dimensional body is started, the carrier plate (18) can be submerged into the mixture (16) up to a pre-calculated distance from the interface of the inhibition zone (22). In some embodiments, the pre-calculated distance corresponds to a portion of the composition that can be cured if irradiated with actinic radiation from the radiation unit (11) underneath the chamber (12), and is herein called "translating portion" (19). The photocured translating portion (19) can adhere to the carrier plate (18) and be vertically moved away from the interface of the inhibition zone (22). Concurrently with the upwards movements of the carrier plate (18) and the attached solidified translating portion (19), mixture (16) from the sides of the polymerization chamber or from a reservoir (20) can fill the released space. The construction is designed to move the carrier plate (18) continuously upwards in z direction at a speed that corresponds to the time needed for curing the mixture (16) that replaces the upwards moved solidified translating portion. FIG. 1B provides one embodiment having a partially formed three-dimensional body (21) having three solidified and unified translating portions and one translating portion (19) which is subjected to curing and attached to the three-dimensional body (21). The increase in distance between the carrier plate (18) and the mixture (16) when forming the three-dimensional body (21) can be caused by moving either the carrier plate (18) or the chamber (12) or both carrier plate (18) and chamber (12) in relation to each other.

The carrier plate (18) of the assembly of the present disclosure is configured for continuous movement to facilitate formation of the three-dimensional body away from the interface of the inhibition zone (22). As used herein, the phrase "interphase of the inhibition zone" (22) can be used interchangeable with the phrase "interface of the mixture," since the inhibition zone is a zone of the mixture, which only distinguishes from the other part of the mixture by the presence of an inhibitor in a concentration that the mixture may not cure if exposed to electromagnetic radiation. Actual solidification and forming of the three dimensional body starts at the interface of the inhibition zone (22), i.e., an interface of the mixture.

The formation of the three dimensional body may not necessarily be considered a layer-by-layer forming process. Instead, the forming process (e.g., curing) may be in the form of a gradient of solidification (e.g., polymerization). The processes of the embodiments herein may facilitate formation of a three-dimensional body having smoother features and may have improved mechanical properties, compared to conventional structures formed by layer-by-layer forming processes.

As used in the context of the present disclosure, continuous translation and growth of the three-dimensional body means that the carrier plate (18) can be moved in a continuous manner or in discrete steps with short stops between each step, as long the stops allow that a gradient of solidification is maintained while forming the three-dimensional body. A gradient of solidification means that especially in the translating portion (19) a continuous polymerization reaction is maintained, with the highest degree of solidification at the farthest distance to the inhibition zone. The three-dimensional body formed by the process of continuous translation can thereby possess a non-layered internal structure, such that in a crosscut along the z-axis, changes in the morphology of the green body are not visible to the naked eye. In comparison, traditional layer by layer build-up of a green body waits until one layer is completely radiation cured before the next layer is applied, which leaves visible cleavage lines in the formed green body, i.e., regions that are not smoothly connected together.

In certain embodiments, the stops in the movement of the carrier plate (18) while conducting continuous translation and forming of the three-dimensional body can be at least about 1 microsecond, for example, at least about 300 microseconds, at least about 500 microseconds, at least about 800 microseconds, or at least about 1000 microseconds. In other embodiments, the stops during continuous translation may be not longer than about 1 second, for example, not longer than about 0.5 seconds, not longer than about 0.3 seconds, not longer than about 0.2 seconds, or not longer than about 0.1 seconds. It will be appreciated that the stops during continuous translation can be a value within any of the minimum and maximum values note above, for example, from about 1 microsecond to about 1 second, from about 300 microseconds to about 0.5 seconds, or from about 1000 microseconds to about 0.1 seconds.

In certain embodiments, the method of the present disclosure can also include one or more longer stops during the forming of the three-dimensional body, such that the gradient of solidification may be interrupted and the translation is not continuous as defined above. Such longer stops may be desired for the making of a body having defined regions which are cleavable.

The cure depth of the electromagnetic radiation (14) applied to the mixture (16) may be affected by the size, type, and concentration of the fillers and the refractive index of the slurry. Notably, the size and concentration of the fillers may be particularly selected to facilitate proper operation of the process in combination with the type of radiation used for the curing process.

In certain embodiments, formation of a three-dimensional body having a suitable strength can include controlling the cure depth relative to a thickness of the translating portion. In one embodiment, the cure depth may be at least about 25% larger than the thickness of the translating portion (19), for example, at least about 30%, at least about 35%, or at least about 40% larger. In another embodiment, the cure depth can be not greater than about 75% of the thickness of the translating portion (19), for example, not greater than about 70% or not greater than about 65%. It will be appreciated that the cure depth can be a value between any of the maximum and minimum values noted above, for example, from about 25% to about 75%, from about 30% to about 70% or from about 35% to about 60% of the thickness of the translating portion (19).

In certain embodiments, a thickness of the translating portion (19) can be at least about 50 μm, for example, at least about 70 μm, or at least about 100 μm. In certain embodiments, the thickness of the translating portion may be not greater than about 500 μm, for example, not greater than about 450 μm, or not greater than about 400 μm. It will be appreciated that the thickness of the translating portion can be a value between any of the maximum and minimum values noted above, for example, from about 50 μm to about 500 μm, from about 80 μm to about 450 μm, or from about 100 μm to about 300 μm.

In certain embodiments, the cure depth may be at least about 1 μm larger than the thickness of the inhibition zone (17), for example, at least about 5 μm, at least about 10 μm, at least about 20 μm, or at least about 50 μm larger than the thickness of the inhibition zone. In yet another aspect, the cure depth can be not greater than about 400 μm than the thickness of the inhibition zone, for example, not greater than about 350 μm, not greater than about 300 μm, or not greater than about 250 μm than the thickness of the inhibition zone. It will be appreciated that the cure depth can be a value between any of the maximum and minimum values noted above, for example, within a range of at least about 1 μm to not greater than about 400 μm, from about 5 μm to about 370 μm, or from about 30 μm to about 300 μm larger than the thickness of the inhibition zone.

The thickness of the inhibition zone (17), which can be formed when the inhibitor enters the chamber (12) through the transparent and semipermeable window, (15) may be regulated by the concentration of the inhibitor. The inhibition zone (17) may limit the curing of the mixture (16) in that zone within the chamber (12). The inhibition zone (17) may facilitate limited or no adhesion of the radiation cured material to the bottom of the chamber (12), which may further facilitate simpler release of the body from the chamber after forming is completed.

FIGS. 2A and 2B depict schematically how a semipermeable layer can be integrated at the bottom section of the chamber. In the embodiment of FIG. 2A, the transparent window (24) functions also as a semipermeable layer for the penetration of the inhibitor gas (25), penetrating the transparent window (24) from the bottom of the chamber. FIG. 2B shows an embodiment where an additional semipermeable layer (26) is installed above the transparent window (24) and the inhibitor gas (25) is provided from the sides of the polymerization chamber.

In certain embodiments, the thickness of the semipermeable layer for the penetration of inhibitor gas can be at least about 1 μm, for example, at least about 5 μm, at least about 50 μm, at least about 500 μm, or at least about 1000 μm. The upper thickness of the semipermeable layer may not be limited as long the layer allows sufficient transport of inhibitor gas.

The material of the semipermeable layer may be any material that permits the penetration of inhibitor gas. Non-limiting examples of materials suitable for a semipermeable layer can include, for example, fluoropolymers, such as Teflon (e.g., AF-2400X), polymethylpentene based membranes (PMP), or silicone polymers and copolymers.

The inhibitor may in certain embodiments be an oxygen containing gas, such as air, mixtures of an inert gas and oxygen, or pure oxygen. In another aspect, when oxygen cannot inhibit the activity of the photoinitiator (for example, when a cationic photoinitiator is used) the inhibitor can be an amine, e.g., ammonia, ethyl amine, di- and trialkyl amines, carbon dioxide, or combinations thereof. In certain embodiments, the inhibitor can be pure oxygen, and the oxygen may penetrate the semipermeable layer in an amount of at least about 0.1 Barrer, for example, at least about 1 Barrer, at least about 5 Barrer, at least about 10 Barrer, or at least about 30 Barrer.

The thickness of the inhibition zone can, in certain embodiments, be at least about 0.5 µm, for example, at least about 1.0 µm, at least about 2.0 µm, or at least about 5 µm, or not be greater than about 600 µm, for example, not greater than about 500 µm, not greater than about 300 µm, or not greater than about 100 µm. It will be appreciated that the thickness of the inhibition zone can be a value between any of the maximum and minimum values noted above, for example, from about 0.5 µm to about 600 µm, from about 1.0 µm to about 450 µm, or from about 3 µm to about 200 µm. In some embodiments, polymerization reactions can also occur to a limited extent in the inhibition zone. The inhibition zone may be also described as a gradient of polymerization, where with increasing distance from the bottom surface of the chamber larger amounts of polymerization reactions can happen, but these polymerization reactions may not completely cure the mixture, and the mixture is still maintained in a liquid stage. The interface of the inhibition zone may be understood as the area of the inhibition zone where the polymerization reactions start to form a solid material.

In certain embodiments as otherwise described herein, the actinic radiation can be created by a laser or a light emitting diode (LED). An electron beam can alternatively be used to cure the compositions described herein.

In certain embodiments as otherwise described herein, the actinic radiation has an energy of at least about 20 mJ/cm$^2$, for example, at least about 30 mJ/cm$^2$, at least about 50 mJ/cm$^2$, or at least about 80 mJ/cm$^2$, or not greater than about 450 mJ/cm$^2$, for example, not greater than about 400 mJ/cm$^2$, not greater than about 350 mJ/cm$^2$, not greater than about 300 mJ/cm$^2$, not greater than about 250 mJ/cm$^2$, not greater than about 200 mJ/cm$^2$, or not greater than about 100 mJ/cm$^2$, or from about 20 mJ/cm$^2$ to about 450 mJ/cm$^2$, or from about 30 mJ/cm$^2$ to 300 mJ/cm$^2$, or from about 40 mJ/cm$^2$ to about 200 mJ/cm$^2$, or from about 20 mJ/cm$^2$ to about 100 mJ/cm$^2$.

In certain embodiments, the mixture is cured in the translation portion (19) during continuous forming of the three dimensional body at a UV power of at least 0.1 mW/cm$^2$, for example, at least 0.5 mW/cm$^2$, at least 1.0 mW/cm$^2$, or at least 3.0 mW/cm$^2$, or not greater than 250 mW/cm$^2$, for example, not greater than 150 mW/cm$^2$, or not greater than mW/cm$^2$, or not greater than 50 mW/cm$^2$, or not greater than 30 mW/cm$^2$, or not greater than 20 mW/cm$^2$, or not greater than 13.0 mW/cm$^2$, or not greater than 12 mW/cm$^2$, or not greater than 10 mW/cm$^2$. It will be appreciated that the applied UV power can be a value between any of the maximum and minimum values noted above, for example, from 0.1 mW/cm$^2$ to 250.0 mW/cm$^2$, or from 1.0 mW/cm$^2$ to 100 mW/cm$^2$, or from 2.0 mW/cm$^2$ to 10 mW/cm$^2$.

In certain embodiments of the methods as otherwise described herein, a three-dimensional body can be continuously manufactured at a high production speed. In one embodiment, the creating of the three dimensional body can be completed at a speed rate of at least about 25 mm/hr, for example, at least about 30 mm/hr, or at least about 40 mm/hr, or at least about 50 mm/hr, or at least about 70 mm/hr.

The person of ordinary skill in the art will appreciate that a wide variety of processes, can be used to form articles from the photocurable compositions described herein. For example, in certain embodiments, other UV-based 3D-printing platforms can be used, for example, stereolithography and digital light projector-based methods.

The present inventors have further determined that such irradiated materials can be further polymerized upon post-curing, providing additional desirable material properties. For example, in certain embodiments as otherwise described herein, the polysiloxane of the irradiated composition (i.e., before post-curing) comprises at least about two alkenyl groups.

Accordingly, in certain embodiments as otherwise described herein, the method further comprises optionally separating the irradiated composition from any remaining non-irradiated polymerizable composition, and then post-curing the irradiated composition. In certain such embodiments, post-curing comprises heating the irradiated composition to an elevated temperature. In other embodiments, post-curing comprises irradiating the composition (e.g., with UV radiation) for an extended period of time (e.g., sufficient to activate a light-activated hydrosilylation catalyst). The present inventors have determined that, advantageously, the alkenyl groups and, in certain embodiments, the Si—H groups, can react to form additional cross-links.

Accordingly, in certain embodiments as otherwise described herein the method further comprises heating the irradiated composition to an elevated temperature. For example, in certain such embodiments, the elevated temperature is within the range of 25° C., to 250° C., or 25° C. to 225° C., or 25° C. to 200° C., or 25° C. to 175° C., or 25° C. to 150° C., or 25° C. to 125° C., or 25° C. to 100° C., or 25° C. to 75° C., or 50° C. to 250° C., or 75° C. to 250° C., or 100° C. to 250° C., or 125° C. to 250° C., or 150° C. to 250° C., or 175° C. to 250° C., or 200° C. to 250° C., or 50° C. to 200° C., or 50° C. to 150° C., or 50° C. to 100° C.

In another example, in certain embodiments as otherwise described herein, the method comprises further irradiating the composition with UV radiation. In certain such embodiments, the composition is further irradiated with radiation having a wavelength within the range of 315 nm to 400 nm, or 340 nm to 400 nm. In certain such embodiments, the composition is further irradiated with a radiation power of at least 50 W, or at least 100 W, or at least 200 W, or at least 300 W, or at least 400 W, or at least 500 W. In certain such embodiments, the composition is further irradiated for a period of time within the range of 1 min. to 1 hr., or 1 min. to 45 min., or 1 min, to 30 min., or 2 min. to 25 min., or 2 min. to 20 min., or 2 min. to 15 min.

Another aspect of the disclosure is a cross-linked article, made by a method described herein. For example, in certain embodiments as otherwise described herein, the cross-linked article is the polymerization product of a polymerizable composition described herein.

EXAMPLES

The Examples that follow are illustrative of specific embodiments of the invention, and various uses thereof. They are set forth for explanatory purposes only, and are not to be taken as limiting the invention.

Example 1. Formulation

Formulation A was prepared by adding the polysiloxanes, photoinitiators, and hydrosilylation catalysts of Table 1 to a glass container, and mixing in a mechanical mixture at a rate of about 2,000 rpm at room temperature until the mixture appeared homogeneous. The mixture was maintained below 40° C. throughout mixing.

TABLE 1

Formulation A

| Component | Material | wt. % |
|---|---|---|
| Polysiloxane 1 | Polysiloxane having about 2 vinyl groups and about 5-10 mol. % methacryloyloxyalkyl groups; 7,000-10,000 cst viscosity | 11.1 |
| Polysiloxane 2 | Dow Corning Shore QP1-270 | 16.7 |
| Polysiloxane 3 | LSR (parts A and B) | 16.7 |
| Polysiloxane 4 | Polysiloxane having about 2 methacryloyloxyalkyl groups (Gelest DMS-R18) | 11.1 |
| Polysiloxane 5 | Polysiloxane having about 1 Si-H group and about 1 vinyl group (Gelest DMS-HV15) | 41.7 |
| Catalyst 1 | UV-LSR Pt catalyst (in silicone oil) | 1.1 |
| Catalyst 2 | Gelest MDS-HV15 Pt catalyst (in silicone oil) | 0.4 |
| Photoinitiator 1 | TPO | 0.72 |
| Photoinitiator 2 | DMAPA | 0.18 |

Formulation C was prepared similarly, but without a polysiloxane having at east about two alkenyl groups and at least about two (meth)acryloyl groups.

Example 2. Curing

A continuous-additive 3-D printer (Envisiontec CDLM 3D printer) was calibrated and prepared for printing. At least about 50 mL of a polymerizable composition of Example 1 was poured into the clean tray and the clean build platform head was attached, ensuring that the ventilation outlet is in proper position. Following printing, the build platform head was removed from the printer using a spatula to carefully scrape off the printed object. The surface of the printed object was carefully cleaned with Q-tips, then washed with isopropanol, and post-curing was performed at 120° C. for 48 hrs.

Figure 3:
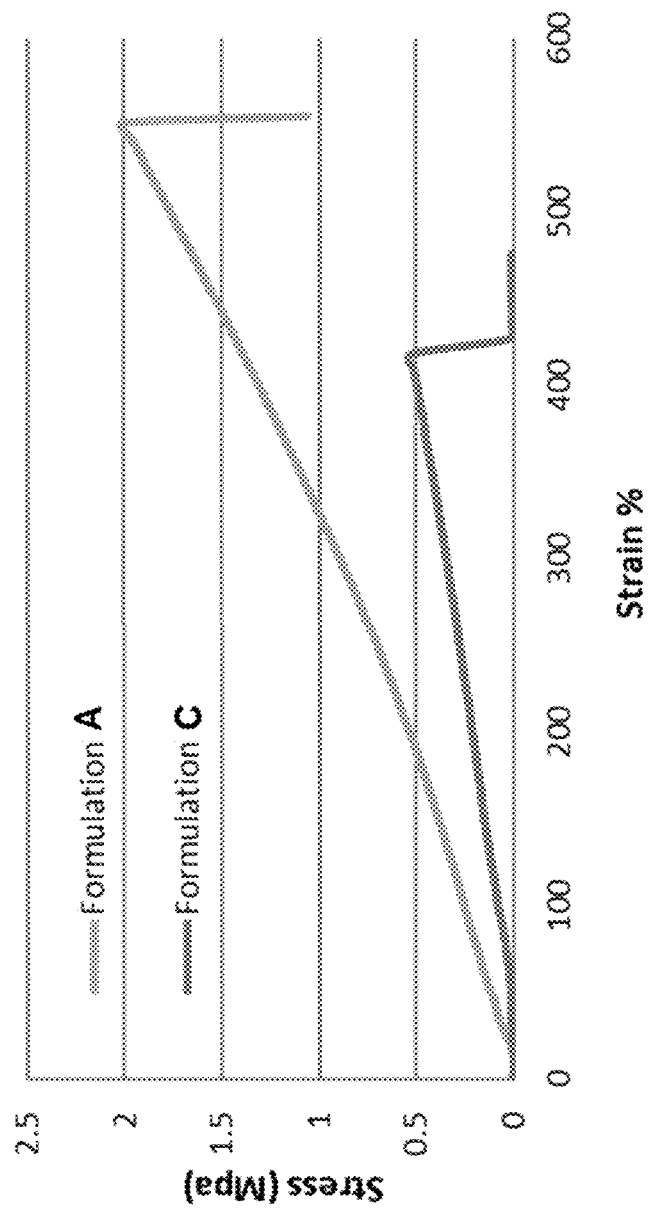
FIG. 3 is a plot showing the tensile strength of 3-D printed products of a variety of polysiloxane formulations described herein.

The physical properties of the 3-D printed products of Formulation A and Formulation C were measured; results are provided in Table 2, below, and in FIG. 3. Mechanical data were determined according to ASTM D638.

TABLE 2

3-D Printed Properties

| | Tensile Strength (MPa) | Strain at Break (%) | Hardness Shore A |
|---|---|---|---|
| Formulation A | 2.0 | 550 | 30 |
| Formulation C | 0.5 | 420 | 27 |

The results show that the material properties of 3-D printed products of Formulation A were desirably improved over the products of a formulation lacking a polysiloxane having at least about 2 alkenyl groups and at least about 2 (meth)acryloyl groups.

Additional aspects and embodiments of the disclosure are provided by the following enumerated embodiments, which can be combined in any number and in any combination that is not technically or logically inconsistent.

Embodiment 1. A polysiloxane having at least about two alkenyl groups and at least about two (meth)acryloyl groups per molecule.

Embodiment 2. The polysiloxane of embodiment 1, wherein one or more (e.g., each) alkenyl group is independently a terminal alkenyl group, e.g., a but-3-enyl group, an allyl group, or a vinyl group.

Embodiment 3. The polysiloxane of embodiment 1, wherein each alkenyl group is vinyl group.

Embodiment 4. The polysiloxane of embodiment 1, wherein each alkenyl group is an allyl group.

Embodiment 5. The polysiloxane of any of embodiments 1-4, wherein one or more (e.g., each) alkenyl group is independently a non-terminal alkenyl group, e.g., a prop-1-enyl group or a but-2-enyl group.

Embodiment 6. The polysiloxane of any of embodiments 1-5, having about 2 alkenyl groups per molecule, e.g., in the range of 1.90-2.10 alkenyl groups per molecule.

Embodiment 7. The polysiloxane of any of embodiments 1-5, comprising 2 or more alkenyl groups, for example, a number of alkenyl groups within the range of 2 to 1,000, e.g., in the range of 2 to 750, or 2 to 500, or 2 to 500, or 2 to 400, or 2 to 300, or 2 to 200, or 2 to 100, or 2 to 50, or 2 to 20, or 2 to 10.

Embodiment 8. The polysiloxane of any of embodiments 1-5, comprising 3 or more alkenyl groups, for example, a number of alkenyl groups within the range of 3 to 1,000, e.g., 3 to 750, or 3 to 500, or 3 to 500, or 3 to 400, or 3 to 300, or 3 to 200, or 3 to 100, or 3 to 50, or 3 to 20, or 3 to 10.

Embodiment 9. The polysiloxane of any of embodiments 1-8, wherein the number of siloxane repeat units of the polysiloxane comprising an alkenyl group is within the range or 0.001% to 10% of the total number of siloxane repeat units of the polysiloxane.

Embodiment 10, The polysiloxane of any of embodiments 1-8, wherein the number of siloxane repeat units of the polysiloxane comprising an alkenyl group is within the range of 2% to 20% of the total number of siloxane repeat units of the polysiloxane.

Embodiment 11, The polysiloxane of any of embodiments 1-10, wherein the at least about two alkenyl groups are provided as pendant groups from internal siloxanes of the polysiloxane.

Embodiment 12. The polysiloxane of any of embodiments 1-10, wherein the at least about two alkenyl groups are provided at ends of the polysiloxane.

Embodiment 13, The polysiloxane of any of embodiments 1-10, wherein the at least about two alkenyl groups are provided as a combination of at one or more ends of the polysiloxane and as pendant groups from one or more internal siloxanes of the polysiloxane.

Embodiment 14. The polysiloxane of any of embodiments 1-13, wherein one or more (e.g., each) (meth)acryloyl group is independently a (meth)acryloyloxy group, e.g., a (meth)acryloyloxyalkyl group.

Embodiment 15. The poylsiloxane of any of embodiments 1-14, comprising about 2 (meth)acryloyl groups, e.g., in the range of 1.90 to 2.10 (meth)acryloyl groups.

Embodiment 16. The polysiloxane of any of embodiments 1-15, comprising 2 or more (meth)acryloyl groups, for example, a number of (meth)acryloyl groups within the range of 2 to 1,000, e.g., 2 to 750, or 2 to 500, or 2 to 500, or 2 to 400, or 2 to 300, or 2 to 200, or 2 to 100, or 2 to 50, or 2 to 20, or 2 to 10.

Embodiment 17. The polysiloxane of any of embodiments 1-15, comprising 3 or more (meth)acryloyl groups, for example, a number of (meth)acryloyl groups within the range of 3 to 1,000, e.g., in the range of 3 to 750, or 3 to 500, or 3 to 500, or 3 to 400, or 3 to 300, or 3 to 200, or 3 to 100, or 3 to 50, or 3 to 20, or 3 to 10.

Embodiment 18. The polysiloxane of any of embodiments 1-17, wherein the number of siloxane repeat units of the polysiloxane comprising a (meth)acryloyl group is within the range of 0.001% to 10% of the total number of siloxane repeat units of the polysiloxane.

Embodiment 19. The polysiloxane of any of embodiments 1-17, wherein the number of siloxane repeat units of the polysiloxane comprising a (meth)acryloyl group is within the range of 2% to 20% of the total number of siloxane repeat units of the polysiloxane.

Embodiment 20. The polysiloxane of any of embodiments 1-17, wherein the at least about two (meth)acryloyl groups are provided as pendant groups from internal siloxanes of the polysiloxane.

Embodiment 21. The polysiloxane of any of embodiments 1-17, wherein the at least about two (meth)acryloyl groups are provided at ends of the polysiloxane.

Embodiment 22. The polysiloxane of any of embodiments 1-17, wherein the at least about two (meth)acryloyl groups are provided as a combination of at one or more ends of the polysiloxane and as pendant groups from one or more internal siloxanes of the polysiloxane.

Embodiment 23. The polysiloxane of any of embodiments 1-10 and 14-19, wherein
the at least about two alkenyl groups (e.g., about two alkenyl groups) are provided at ends of the polysiloxane; and
the at least about two (meth)acryloyl groups (e.g., 3 (meth)acryloyl groups to 1,000 (meth)acryloyl groups) are provided as pendant groups from internal siloxanes of the polysiloxane.

Embodiment 24. The polysiloxane or any of embodiments 1-10 and 14-19, wherein
the at least about two alkenyl groups (e.g., 3 alkenyl groups to 1,000 alkenyl groups) are provided as pendant groups from internal siloxanes of the polysiloxane; and
the at least about two (meth)acryloyl groups (e.g., about two (meth)acryloyl groups) are provided at ends of the polysiloxane.

Embodiment 25. The polysiloxane of any of embodiments 1-10 and 14-19, wherein two or more alkenyl groups (e.g., 3 alkenyl groups to 1,000 alkenyl groups) and two or more (meth)acryloyl groups (e.g., 3 (meth)acryloyl groups to 1,000 (meth)acryloyl groups) are provided as pendant groups from internal siloxanes of the polysiloxane.

Embodiment 26. The polysiloxane of embodiment 25, wherein one or more alkenyl groups (e.g., two alkenyl groups) are provided at ends of the polysiloxane.

Embodiment 27. The polysiloxane of any of embodiments 23-26, wherein
each alkenyl group is independently a terminal alkenyl group (e.g., vinyl); and
each (meth)acryloyl group is independently a (meth) acryloyloxyalkyl group (e.g., (meth)acryloyloxypropyl).

Embodiment 28. The polysiloxane of any of embodiments 1-27, comprising a compound of Formula I:

(I)

wherein
A is

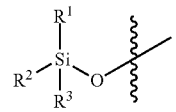

and A' is

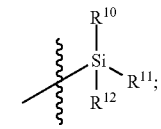

in which each of $R^1$, $R^2$, $R^3$, $R^{10}$, $R^{11}$, and $R^{12}$ is independently $C_2$-$C_{12}$ alkenyl, [((meth)acryloyloxy) $C_1$-$C_{12}$ alkyl], or $C_1$-$C_{60}$ (e.g., $C_1$-$C_6$, or $C_1$-$C_3$) hydrocarbon;

B is

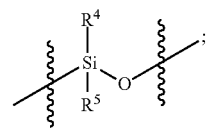

in which each of $R^4$ and $R^5$ is independently $C_1$-$C_{60}$ (e.g., $C_1$-$C_6$, or $C_1$-$C_3$) hydrocarbon;

C is

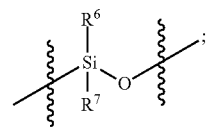

in which $R^6$ is $C_2$-$C_{12}$ alkenyl and $R^7$ is $C_1$-$C_{60}$ (e.g., $C_1$-$C_6$, or $C_1$-$C_3$) hydrocarbon;

D is

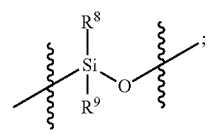

In which $R^8$ is [((meth)acryloyloxy) $C_1$-$C_{12}$ alkyl] and $R^9$ is $C_1$-$C_{60}$ (e.g., $C_1$-$C_6$, or $C_1$-$C_3$) hydrocarbon; and each of P, Q, X, Y, and Z is independently 0-20,000, provided that at least one of P, Q, X, Y, and Z is not zero, and that the first polysiloxane comprises at least two alkenyl groups and at least two (meth)acryloyl groups.

Embodiment 29. The polysiloxane of embodiment 28, wherein
each of $R^1$, $R^3$, $R^{10}$, and $R^{12}$ is independently $C_1$-$C_{60}$ (e.g., $C_1$-$C_6$, or $C_1$-$C_3$) hydrocarbon;
each of $R^2$ and $R^{11}$ is independently [((meth)acryloyloxy) $C_1$-$C_{12}$ alkyl]; and Q is 1-10,000 (e.g., 1-5,000).

Embodiment 30. The polysiloxane of embodiment 29, wherein
each of X, Y, and Z is 0; and
P is 1-10,000 (e.g., 1-5,000).

Embodiment 31. The polysiloxane of embodiment 28, wherein each of P, Q, X, Y, and Z is independently 1-10,000 (e.g., 1-5,000).

Embodiment 32. The polysiloxane of embodiment 31, wherein Q is 1-5,000 (e.g., 1-2,000) and Y is 2-2,000 (e.g., 2-1,000), Embodiment 33. The polysiloxane of embodiment 31 or 32, wherein
each of $R^1$, $R^3$, $R^{10}$, and $R^{12}$ is independently $C_1$-$C_{60}$ (e.g., $C_1$-$C_6$, or $C_1$-$C_3$) hydrocarbon; and

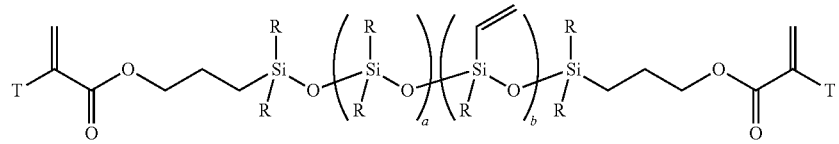

each of $R^2$ and $R^{11}$ is independently $C_2$-$C_{12}$ alkenyl.

Embodiment 34. The polysiloxane of embodiment 31 or 32, wherein each of $R^1$, $R^2$, $R^3$, $R^{10}$, $R^{11}$, and $R^{12}$ is independently $C_1$-$C_{60}$ (e.g., $C_1$-$C_5$, or $C_1$-$C_3$) hydrocarbon.

Embodiment 35. The polysiloxane of any of embodiments 1-34, terminated with two or more (meth)acryloyloxy-alkyl groups (e.g., (meth)acryloyloxypropyl groups) and having two or more vinyl groups along its backbone.

Embodiment 36. The polysiloxane of any of embodiments 1-34, having two or more vinyl groups and two or more (meth)acryloyloxyalkyl groups (e.g., (meth)acryloyloxypropyl groups) along its backbone.

Embodiment 37. The polysiloxane of embodiment 36, comprising 1-20 mol. % (meth)acryloyloxyalkyl groups.

Embodiment 38. The polysiloxane of embodiment 36 or 37, terminated with one or more vinyl groups.

Embodiment 39. The polysiloxane of any of embodiments 1-32, having a molecular weight within the range of 1 kDa to 100 kDa, e.g., or 10 kDa to 100 kDa, or 25 kDa to 80 kDa.

Embodiment 40. The polysiloxane of any of embodiments 1-33, having a viscosity within the range of 1,000 cst to 20,000 cst, e.g., 2,000 cst to 15,000 cst, or 2,000 cst to 10,000 cst.

Embodiment 41. The polysiloxane of any of embodiments 1-27, having the structural formula

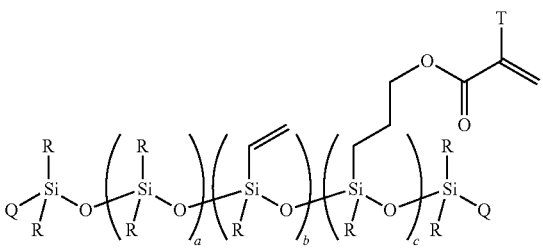

wherein each R is independently $C_1$-$C_3$ alkyl, each Q is independently vinyl, allyl, or $C_1$-$C_3$ alkyl, each T is H or CH$_3$, b is in the range of 1.9 to 5, and a and c are selected to provide the polysiloxane with an overall mole percentage of (meth)acrylate-bearing siloxane subunits (i.e., on a silicon mol % basis) in the range of 1-20%, and a, b and c are selected to provide a weight-average molecular weight of no more than 1000000 Da.

Embodiment 42. The polysiloxane of embodiment 41, wherein each Q is $C_1$-$C_3$ alkyl, e.g., methyl.

Embodiment 43. The polysiloxane of embodiment 41, wherein each Q is vinyl or allyl.

Embodiment 44. The polysiloxane of any of embodiments 1-27, having structural formula

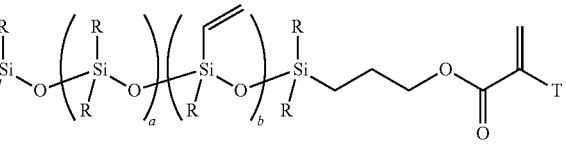

wherein each R is independently $C_1$-$C_3$ alkyl, each T is H or CH$_3$, b is in the range of 1.9 to 5, and a and b are selected to provide a weight-average molecular weight of no more than 1000000 Da.

Embodiment 45. The polysiloxane of any of embodiments 41-44, wherein each R is methyl.

Embodiment 46. The polysiloxane of any of embodiments 41-45, wherein each T is H.

Embodiment 47. The polysiloxane of any of embodiments 41-45, wherein T is CH$_3$.

Embodiment 48. The polysiloxane of any of embodiments 41-47, wherein b is 1.9-3.

Embodiment 49. The polysiloxane of any of embodiments 41-47, wherein b is 1.9-2.5.

Embodiment 50. The polysiloxane of any of embodiments 41-49, having a viscosity in the range of 1000-100000 cst at 20° C., e.g., 2000-20000 cst or 5000-10000 cst at 20° C.

Embodiment 51. The polysiloxane of any of embodiments 41-50, having a weight-average molecular weight of no more than 500000 Da or no more than 100000 Da.

Embodiment 52. A polymerizable composition comprising
a first polysiloxane according to any of embodiments 1-51, present in an amount within the range of 2 wt. % to 99.9 wt. %;
an effective amount of a photoinitiator, present, for example, in an amount within the range of 0.01 wt. % to about 10 wt. %; and
an effective amount of a thermal initiator, present, for example, in an amount within the range of 0.01 wt. % to about 10 wt. %.

Embodiment 53. The composition of embodiment 52, wherein the thermal initiator is present in an amount within the range of 0.05 wt. % to 8 wt. %, or 0.1 wt. % to 6 wt. %, or 0.5 wt. % to 5 wt. %.

Embodiment 54. The composition of embodiment 52 or 53, wherein the thermal initiator is selected from di-aralkyl peroxides, alkyl-aralkyl peroxides, and di-alkyl peroxides.

Embodiment 55. A polymerizable composition comprising
- a first polysiloxane according to any of embodiments 1-51, present in an amount within the range of 2 wt. % to 99.9 wt. %,
- a second polysiloxane having at least about one Si—H group (e.g., at least about two Si—H groups), present in an amount within the range of 0.05 wt. % to 50 wt. %;
- an effective amount of a photoinitiator, present, for example, in an amount within the range of 0.01 wt. % to about 10 wt. %; and
- an effective amount of a hydrosilylation catalyst, present, for example, in an amount within the range of 0.001 wt. % to about 10 wt. %.

Embodiment 56. The composition of embodiment 55, wherein the second polysiloxane is present in an amount within the range of 1 wt. % to 40 wt. %.

Embodiment 57. The composition of embodiment 55 or 56, wherein the molecular weight of the second polysiloxane is within the range of 1 kDa to 100 kDa, or 10 kDa to 100 kDa, or 25 kDa to 80 kDa.

Embodiment 58. The composition of any of embodiments 55-57, wherein the molar ratio of Si—H groups present in the composition to alkenyl groups present in the composition is within the range of 3:2 to 2:3, or within the range of 5:4 to 4:5, or within the range of 9:8 to 8:9.

Embodiment 59. The composition of any of embodiments 55-58, wherein the hydrosilylation catalyst is present in an amount within the range of 0.01 wt. % to 8 wt. %, or 0.05 wt. % to 6 wt. %, or 0.1 wt. % to 4 wt. %.

Embodiment 60. The composition of any of embodiments 55-59, wherein the hydrosilylation catalyst is a platinum catalyst.

Embodiment 61. The composition of any of embodiments 52-60, wherein the photoinitiator is selected from bis (2,4,6-trimethylbenzoyl)-phenylphosphineoxide, bis-(4-Methoxybenzoyl)diethylgermanium, and p-(octyloxyphenyl)-phenyliodonium hexafluoroantimonate.

Embodiment 62. The composition of any of embodiments 52-61, wherein the photoinitiator is 1-phenyl-1,2-propanedione.

Embodiment 63. The composition of any of embodiments 52-61, wherein the photoinitiator is a mixture of two or more photoinitiators (e.g., two photoinitiators Embodiment 64. The composition of embodiment 63, wherein the mixture of photoinitiators comprises diphenyl(2,4,6-trimethylbenzoyl)phosphine oxide (TPO) and 2,2-dimethoxy-2-phenylacetophenone (DMAPA) (e.g., present in a molar ratio of 10:90 to 30:70).

Embodiment 65. The composition of any of embodiments 52-64, wherein the photoinitiator is present in an amount within the range of 0.01 wt. % to 8 wt. %, or 0.05 wt. % to 6 wt. %, or 0.1 wt. % to 4 wt. %.

Embodiment 66. The composition of any of embodiments 52-65, further comprising one or more of
- a third polysiloxane having at least about one alkenyl group (e.g., at least about two alkenyl groups), present in an amount within the range of 0.05 wt. % to 60 wt. %; and
- a fourth polysiloxane having at least about one (meth) acryloyl group (e.g., at least about two (meth)acryloyl groups), present in an amount within the range of 0.05 wt. % to 40 wt. %.

Embodiment 67. The composition of embodiment 66, wherein the third polysiloxane is present in an amount within the range of 1 wt. % to 40 wt. %, Embodiment 68. The composition of embodiment 66 or 67, wherein the molecular weight of the third polysiloxane is within the range of 1 kDa to 100 kDa, or 10 kDa to 100 kDa, or 25 kDa to 80 kDa.

Embodiment 69. The composition of any of embodiments 66-68 wherein the fourth polysiloxane is present in an amount within the range of 1 wt. % to 30 wt. %.

Embodiment 70. The composition of any of embodiments 66-69, wherein the molecular weight of the fourth polysiloxane is within the range of 1 kDa to 50 kDa, or 5 kDa to 40 kDa, or 10 kDa to 30 kDa.

Embodiment 71. The polymerizable composition of any of embodiments 52-70, further comprising a fifth polysiloxane having at least about one Si—H group and at least about one alkenyl group, present in an amount within the range of 0.05 wt. % to 80 wt. %, and optionally an effective amount additional hydrosilylation catalyst, present, for example, in an amount within the range of 0.01 wt. % to 10 wt. %.

Embodiment 72. The composition of embodiment 71, wherein the fifth polysiloxane is present in an amount within the range of 10 wt. % to 60 wt. %.

Embodiment 73. The composition of embodiment 71 embodiment 72, wherein the molecular weight of the fifth polysiloxane is within the range of 1 kDa to 100 kDa, or 1 kDa to 70 kDa, or 5 kDa to 30 kDa.

Embodiment 74. The composition of any of embodiments 55-73, wherein the first polysiloxane is present in an amount within the range of 5 wt. % to 30 wt. %; the second polysiloxane is present in an amount within the range of 10 wt. % to 35 wt. %;
- the third polysiloxane is present in an amount within the range of 10 wt. % to 35 wt. %,
- the fourth polysiloxane is present in an amount within the range of 5 wt. % to 30 wt. %; and
- the fifth polysiloxane is present in an amount within the range of 15 wt. % to 50 wt. %.

Embodiment 75. The composition of any of embodiments 52-74, further comprising a filler present in an amount within the range of 1 wt. % to 50 wt. %.

Embodiment 76. The composition of embodiment 75, wherein the filler comprises one or more non-reactive polysiloxanes or mono-functional reactive polysiloxanes.

Embodiment 77. The composition of embodiment 75 or 76, wherein the filler comprises ceramic particles, glass particles, metallic particles, polymeric particles, or a combination thereof.

Embodiment 78. The composition of any of embodiments 52-77, having a viscosity within the range of 1,000 cst to 10,000 cst, or 2,000 cst to 10,000 cst, or 2,000 cst to 8,000 cst.

Embodiment 79. A method for preparing a three-dimensional body, the method comprising
- providing a polymerizable composition according to any of embodiments 52-78; and
- irradiating at least a portion of the polymerizable composition with actinic radiation effective to initiate reaction of the photoinitiatior.

Embodiment 80. The method of embodiment 79, comprising
- providing the polymerizable composition and optionally, a solvent, between a substrate and an actinic radiation source; and then concurrently, irradiating at least a portion of the polymerizable composition with actinic radiation and translating the substrate in a direction away from the actinic radiation source.

Embodiment 81. The method of embodiment 79 or 80, wherein the first polysiloxane of the irradiated composition (e.g., before post-curing) comprises at least about two alkenyl groups.

Embodiment 82. The method of any of embodiments 79-81, wherein the actinic radiation has a wavelength of less than 600 nm (e.g., within the range of 350 nm to 450 nm, or 370 nm to 420 nm).

Embodiment 83. The method of any of embodiments 79-82, wherein the energy of the actinic radiation is within the range of 20 mJ/cm$^2$ to 450 mJ/cm$^2$.

Embodiment 84. The method of embodiment 80 or 81, further comprising
optionally, separating the irradiated composition from the remaining non-irradiated polymerizable composition; and then
post-curing the irradiated composition.

Embodiment 85. The method of embodiment 84, wherein post-curing comprises heating the irradiated composition to an elevated temperature.

Embodiment 86. The method of embodiment 85, wherein the elevated temperature is within the range of 25° C. to 250° C., e.g., 50° C. to 150° C., or 25° C. to 75° C., Embodiment 87, The method of embodiment 84, wherein post-curing comprises further irradiating the composition for an extended period of time.

Embodiment 88. The method of embodiment 87, wherein the composition is further irradiated with radiation having a wavelength within the range of 315 nm to 400 nm (e.g., 340 nm to 400 nm), Embodiment 89. An article made by a method of any of embodiments 80-88.

Embodiment 90. An article that is the polymerization product of a polymerizable composition of any of embodiments 52-79.

The particulars shown herein are by way of example and for purposes of illustrative discussion of the preferred embodiments of the present invention only and are presented in the cause of providing what is believed to be the most useful and readily understood description of the principles and conceptual aspects of various embodiments of the invention. In this regard, no attempt is made to show structural details of the invention in more detail than is necessary for the fundamental understanding of the invention, the description taken with the drawings and/or examples making apparent to those skilled in the art how the several forms of the invention may be embodied in practice. Thus, before the disclosed processes and devices are described, it is to be understood that the aspects described herein are not limited to specific embodiments, apparati, or configurations, and as such can, of course, vary. It is also to be understood that the terminology used herein is for the purpose of describing particular aspects only and, unless specifically defined herein, is not intended to be limiting.

The terms "a," "an," "the" and similar referents used in the context of describing the invention (especially in the context of the following claims) are to be construed to cover both the singular and the plural, unless otherwise indicated herein or clearly contradicted by context. Recitation of ranges of values herein is merely intended to serve as a shorthand method of referring individually to each separate value falling within the range. Unless otherwise indicated herein, each individual value is incorporated into the specification as if it were individually recited herein. Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

All methods described herein can be performed in any suitable order of steps unless otherwise indicated herein or otherwise clearly contradicted by context. The use of any and all examples, or exemplary language (e.g., "such as") provided herein is intended merely to better illuminate the invention and does not pose a limitation on the scope of the invention otherwise claimed. No language in the specification should be construed as indicating any non-claimed element essential to the practice of the invention.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to". Words using the singular or plural number also include the plural and singular number, respectively. Additionally, the words "herein," "above," and "below" and words of similar import, when used in this application, shall refer to this application as a whole and not to any particular portions of the application.

As will be understood by one of ordinary skill in the art, each embodiment disclosed herein can comprise, consist essentially of or consist of its particular stated element, step, ingredient or component. As used herein, the transition term "comprise" or "comprises" means includes, but is not limited to, and allows for the inclusion of unspecified elements, steps, ingredients, or components, even in major amounts. The transitional phrase "consisting of" excludes any element, step, ingredient or component not specified. The transition phrase "consisting essentially of" limits the scope of the embodiment to the specified elements, steps, ingredients or components and to those that do not materially affect the embodiment.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements.

Groupings of alternative elements or embodiments of the invention disclosed herein are not to be construed as limitations. Each group member may be referred to and claimed individually or in any combination with other members of the group or other elements found herein. It is anticipated that one or more members of a group may be included in, or deleted from, a group for reasons of convenience and/or patentability. When any such inclusion or deletion occurs, the specification is deemed to contain the group as modified thus fulfilling the written description of all Markush groups used in the appended claims.

Some embodiments of this invention are described herein, including the best mode known to the inventors for carrying out the invention. Of course, variations on these described embodiments will become apparent to those of ordinary skill in the art upon reading the foregoing description. The inventor expects skilled artisans to employ such variations as appropriate, and the inventors intend for the invention to be practiced otherwise than specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

Furthermore, numerous references have been made to patents and printed publications throughout this specification. Each of the cited references and printed publications are individually incorporated herein by reference in their entirety.

In closing, it is to be understood that the embodiments of the invention disclosed herein are illustrative of the principles of the present invention. Other modifications that may be employed are within the scope of the invention. Thus, by way of example, but not of limitation, alternative configurations of the present invention may be utilized in accordance with the teachings herein. Accordingly, the present invention is not limited to that precisely as shown and described.

Terms used herein may be preceded and/or followed by a single dash, "-", or a double dash, "=", to indicate the bond order of the bond between the named substituent and its parent moiety; a single dash indicates a single bond and a double dash indicates a double bond or a pair of single bonds in the case of a spiro-substituent. In the absence of a single or double dash it is understood that a single bond is formed between the substituent and its parent moiety; further, substituents are intended to be read "left to right" unless a dash indicates otherwise. For example, arylalkyl, arylalkyl-, and -alkylaryl indicate the same functionality.

For simplicity, chemical moieties are defined and referred to throughout primarily as univalent chemical moieties (e.g., alkyl, aryl, etc.). Nevertheless, such terms are also used to convey corresponding multivalent moieties under the appropriate structural circumstances clear to those skilled in the art. For example, while an "alkyl" moiety can refer to a monovalent radical (e.g. $CH_3$—$CH_2$—), in some circumstances a bivalent linking moiety can be "alkyl," in which case those skilled in the art will understand the alkyl to be a divalent radical (e.g., —$CH_2$—$CH_2$—), which is equivalent to the term "alkylene." (Similarly, in circumstances in which a divalent moiety is required and is stated as being "aryl," those skilled in the art will understand that the term "aryl" refers to the corresponding divalent moiety, arylene). All atoms are understood to have their normal number of valences for bond formation (i.e., 4 for carbon, 3 for N, 2 for O, and 2, 4, or 6 for S, depending on the oxidation state of the S). Nitrogens in the presently disclosed compounds can be hypervalent, e.g., an N-oxide or tetrasubstituted ammonium salt. On occasion a moiety may be defined, for example, as —B-$(A)_a$, wherein a is 0 or 1, In such instances, when a is 0 the moiety is —B and when a is 1 the moiety is —B-A.

As used herein, the term "alkyl" includes a saturated hydrocarbon having a designed number of carbon atoms, such as 1 to 12 carbons (i.e., inclusive of 1 and 12), 1 to 10 carbons, 1 to 8 carbons, 1 to 6 carbons, 1 to 3 carbons, or 1, 2, 3, 4, 5 or 6. Alkyl group may be straight or branched and depending on context, may be a monovalent radical or a divalent radical (i.e., an alkylene group). For example, the moiety "—$(C_1$-$C_6$alkyl)-O—" signifies connection of an oxygen through an alkylene bridge having from 1 to 6 carbons and $C_1$-$C_3$alkyl represents methyl, ethyl, and propyl moieties. Examples of "alkyl" include, for example, methyl, ethyl, propyl, isopropyl, butyl, iso-, sec-, and tert-butyl, pentyl, and hexyl.

The term "alkoxy" represents an alkyl group of an indicated number of carbon atoms attached to the parent molecular moiety through an oxygen bridge. Examples of "alkoxy" include, for example, methoxy, ethoxy, propoxy, and isopropoxy.

As used herein, the term "alkenyl" includes unsaturated hydrocarbons containing from 2 to 12 carbons (i.e., inclusive of 2 and 12), 2 to 10 carbons, 2 to 8 carbons, 2 to 6 carbons, or 2, 3, 4, 5, or 6, unless otherwise specified, and containing at least one carbon-carbon double bond. An alkenyl group may be straight or branched and depending on context, may be a monovalent radical or a divalent radical (i.e., an alkenylene group). For example, the moiety "—$(C_2$-$C_6$alkenyl)-O—" signifies connection of an oxygen through an alkenylene bridge having from 2 to 6 carbons. Representative examples of alkenyl include, but are not limited to, ethenyl, 2-propenyl, 2-methyl-2-propenyl, 3-butenyl, 4-pentenyl, 5-hexenyl, 2-heptenyl, 2-methyl-1-heptenyl, 3-decenyl, and 3,7-dimethylocta-2,6-dienyl.

As used herein, the term "(meth)acryloyl" includes methacryloyl and acryloyl groups. The term "acryloyl" refers to the group $H_2C$=CH—C(O)—, and the term "methacryloyl" refers to the group $H_2C$=C($CH_3$)—C(O)—. The (meth)acryloyl group can comprise, for example, a (meth)acryloyloxy group, a (meth)acryloyloxyalkyl group, etc.

The term "siloxane" refers generally to materials including the linkage Si—O—Si. The term "siloxane" may refer to disiloxane, i.e., $R_3$Si—O—Si—$R_3$, or polysiloxane, i.e., $R_3$Si—O—$[SiR_2$—$O]_n$—$SiR_3$, wherein n is at least one. As used herein, the term "siloxane" includes cyclic polysiloxanes. The term "siloxane repeat unit" or "siloxane group" refers to the repeating —$[SiR_2$—O]— units comprising a polysiloxane.

The term "silane" refers to saturated chemical compounds consisting of one or multiple silicon atoms linked to each other or one or multiple atoms of other chemical elements as the centers of multiple single bonds. The person of ordinary skill in the art will appreciate that certain siloxanes, e.g., tetrakis(dimethylsilyl) orthosilicate, may also be referred to as silanes.

The term "hydride" refers to a hydrogen functional group bonded to a more electropositive element or group. For example, calcium hydride and sodium hydride both comprise hydride functional groups. In another example, trimethylsilane and hydride-terminated poly(dimethylsiloxane) both comprise hydride functional groups.

The term "substituted," when used to modify a specified group or radical, means that one or more hydrogen atoms of the specified group or radical are each, independently of one another, replaced with the same or different substituent groups as defined below, unless specified otherwise.

The terms "polymerizable" and "polymerized" refer to one or more compounds that can be reacted to provide a larger compound, and to one or more compounds that have been reacted to provide a larger compound, respectively. For example, a composition of a single compound may be polymerizable (i.e., a monomer), and, upon polymerization, may provide a polymerized compound comprising repeating monomer units. Polymerizable or polymerized compositions may also include "curable" or "cured" compositions, or "cross-linkable" or "cross-linked" compositions, in which compositions comprising polymers and, optionally, monomers and/or cross-linkers, can be, or have been, reacted to provide a composition of larger compounds.

What is claimed is:

1. A polysiloxane having at least about two vinyl or allyl groups and at least about two (meth)acryloyl groups per molecule, the polysiloxane having the structural formula:

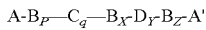

wherein
A is

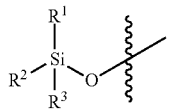

and A' is

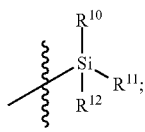

in which each of $R^1$, $R^2$, $R^3$, $R^{10}$, $R^{11}$, and $R^{12}$ is independently vinyl, allyl, [((meth)acryloyloxy) $C_1$-$C_{12}$ alkyl], or $C_1$-$C_6$ hydrocarbon;

B is

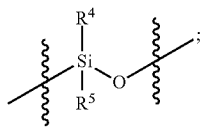

in which each of $R^4$ and $R^5$ is independently $C_1$-$C_6$ hydrocarbon;

C is

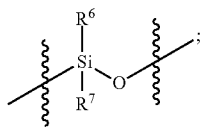

in which $R^6$ is vinyl or allyl and $R^7$ is $C_1$-$C_6$ hydrocarbon;

D is

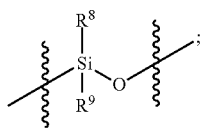

in which $R^8$ is [((meth)acryloyloxy) $C_1$-$C_{12}$ alkyl] and $R^9$ is $C_1$-$C_6$ hydrocarbon; and each of P, q, X, Y, and Z is independently 0-20,000, provided that at least one of P, Q, X, Y, and Z is not zero, and that the first polysiloxane comprises at least two alkenyl groups and at least two (meth)acryloyl groups.

2. The polysiloxane of claim 1, wherein each vinyl or allyl group is a vinyl group.

3. The polysiloxane of claim 1, comprising a number of vinyl or allyl groups within the range of 2 to 1,000.

4. The polysiloxane of claim 1, wherein the number of siloxane repeat units of the polysiloxane comprising an alkenyl group is within the range of 0.001% to 20% of the total number of siloxane repeat units of the polysiloxane.

5. The polysiloxane of claim 1, wherein the at least about two vinyl or allyl groups are provided as pendant groups from internal siloxanes of the polysiloxane.

6. The polysiloxane of claim 1, wherein the at least about two vinyl or allyl groups are provided at ends of the polysiloxane.

7. The polysiloxane of claim 1, wherein each (meth) acryloyl group is a (meth)acryloyloxyalkyl group.

8. The polysiloxane of claim 1, comprising about 2 (meth)acryloyl groups.

9. The polysiloxane of claim 1, comprising a number of (meth)acryloyl groups in the range of 3 to 1,000.

10. The polysiloxane of claim 1, wherein the number of siloxane repeat units of the polysiloxane comprising a (meth)acryloyl group is within the range of 0.001% to 20% of the total number of siloxane repeat units of the polysiloxane.

11. The polysiloxane of claim 1, having a viscosity within the range of 2,000 cst to 15,000 cst.

12. The polysiloxane of claim 1, having the structural formula

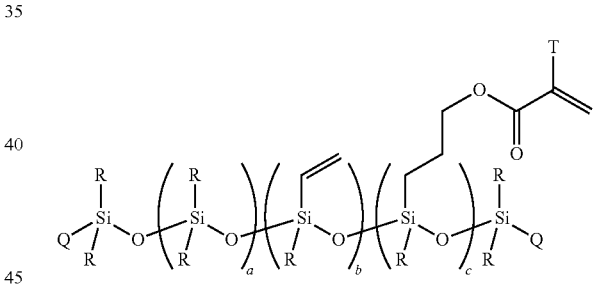

wherein each R is independently $C_1$-$C_3$ alkyl, each Q is independently vinyl, allyl, or $C_1$-$C_3$ alkyl, each T is H or $CH_3$, b is in the range of 1.9 to 5, and a and c are selected to provide the polysiloxane with an overall mole percentage of (meth)acrylate-bearing siloxane subunits in the range of 1-20% on a silicon mol % basis, and a, b and c are selected to provide a weight-average molecular weight of no more than 1000000 Da.

13. The polysiloxane of claim 1, having structural formula

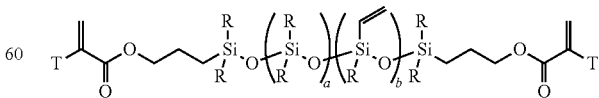

wherein each R is independently $C_1$-$C_3$ alkyl, each T is H or $CH_3$, b is in the range of 1.9 to 5, and a and b are selected to provide a weight-average molecular weight of no more than 1000000 Da.

14. A polymerizable composition comprising
- a first polysiloxane according to claim 1, present in an amount within the range of 2 wt. % to 99.9 wt. %;
- an effective amount of a photoinitiator; and
- an effective amount of a thermal initiator.

15. The composition of claim 14, further comprising one or more of
- a third polysiloxane having at least about one alkenyl group, present in an amount within the range of 0.05 wt. % to 60 wt. %; and
- a fourth polysiloxane having at least about one (meth) acryloyl group, present in an amount within the range of 0.05 wt. % to 40 wt. %.

16. A method for preparing a three-dimensional body, the method comprising
- providing a polymerizable composition according to claim 14; and
- irradiating at least a portion of the polymerizable composition with actinic radiation effective to initiate reaction of the photoinitiatior; and
- thermally post-curing the irradiated composition.

17. The method of claim 16, wherein the irradiation is performed such that a portion of the polymerizable is not irradiated, the method further comprising, before thermally post-curing the irradiated composition, separating the irradiated composition from the non-irradiated polymerizable composition.

18. An article made by a method of claim 17.

19. An article that is the polymerization product of a polymerizable composition of claim 14.

20. A polymerizable composition comprising:
- a first polysiloxane according to claim 1, present in an amount within the range of 2 wt. % to 99.9 wt. %;
- a second polysiloxane having at least about two Si—H groups, present in an amount within the range of 0.05 wt. % to 50 wt %;
- an effective amount of a photoinitiator; and
- an effective amount of a hydrosilylation catalyst.

21. A method for preparing a three-dimensional body, the method comprising providing a polymerizable composition according to claim 20; and
- irradiating at least a portion of the polymerizable composition with actinic radiation effective to initiate reaction of the photoinitiatior; and
- thermally post-curing the irradiated composition.

22. The method of claim 21, wherein the irradiation is performed such that a portion of the polymerizable is not irradiated, the method further comprising, before thermally post-curing the irradiated composition, separating the irradiated composition from the non-irradiated polymerizable composition.

* * * * *